United States Patent
Watanabe et al.

(10) Patent No.: US 11,574,817 B2
(45) Date of Patent: Feb. 7, 2023

(54) FABRICATING AN INTERCONNECTION USING A SACRIFICIAL LAYER

(71) Applicant: International Business Machines Corporation, Armonk, NY (US)

(72) Inventors: Takahito Watanabe, Yokohama (JP); Risa Miyazawa, Isehara (JP); Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 17/308,176

(22) Filed: May 5, 2021

(65) Prior Publication Data

US 2022/0359227 A1     Nov. 10, 2022

(51) Int. Cl.
*H01L 21/48*     (2006.01)
*H01L 23/532*    (2006.01)
*H01L 23/538*    (2006.01)

(52) U.S. Cl.
CPC ...... *H01L 21/4857* (2013.01); *H01L 23/5329* (2013.01); *H01L 23/5383* (2013.01); *H01L 23/53228* (2013.01)

(58) Field of Classification Search
CPC .............. H01L 23/5386; H01L 23/5381
See application file for complete search history.

(56) References Cited

U.S. PATENT DOCUMENTS

| | | | |
|---|---|---|---|
| 6,001,671 A | 12/1999 | Fjelstad | |
| 6,583,053 B2 | 6/2003 | Lu et al. | |
| 7,972,936 B1 | 7/2011 | Brewer et al. | |
| 10,622,311 B2 | 4/2020 | Horibe et al. | |
| 2017/0358507 A1 | 12/2017 | Mori et al. | |
| 2018/0151541 A1 | 5/2018 | Jun et al. | |
| 2019/0051603 A1 | 2/2019 | Horibe et al. | |
| 2020/0388503 A1* | 12/2020 | Uzoh | H01L 21/31133 |
| 2021/0020600 A1* | 1/2021 | Jang | H01L 21/6835 |
| 2021/0098349 A1* | 4/2021 | Miyazawa | H01L 21/481 |
| 2021/0098404 A1 | 4/2021 | Miyazawa et al. | |

OTHER PUBLICATIONS

Esashi et al., "Heterogeneous integration by adhesive bonding", Esashi and Tanaka Micro and Nano Systems Letters, Aug. 2013, 10 pages.

* cited by examiner

*Primary Examiner* — Selim U Ahmed
*Assistant Examiner* — Evan G Clinton
(74) *Attorney, Agent, or Firm* — James Olsen

(57) ABSTRACT

Aspects of the present disclosure relate to a method for fabricating an interconnection layer carrying structure. A carrier is provided. An organic layer is deposited on the carrier, wherein the organic layer includes a multi-layer wiring structure therein, and the uppermost surface is covered with an organic top layer. A sacrificial layer is deposited on the organic top layer. The carrier and the organic layer are diced together with the sacrificial layer.

14 Claims, 23 Drawing Sheets

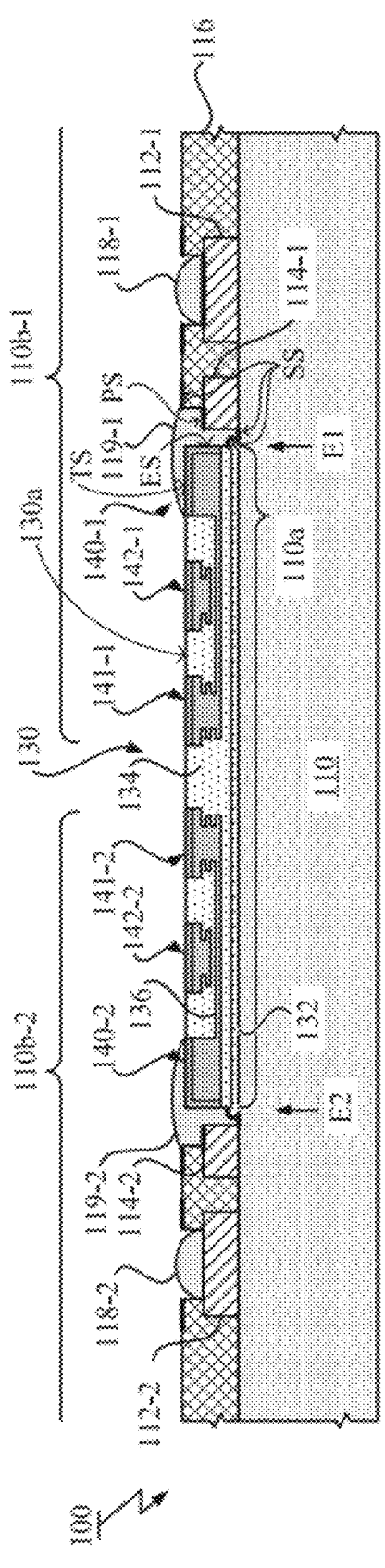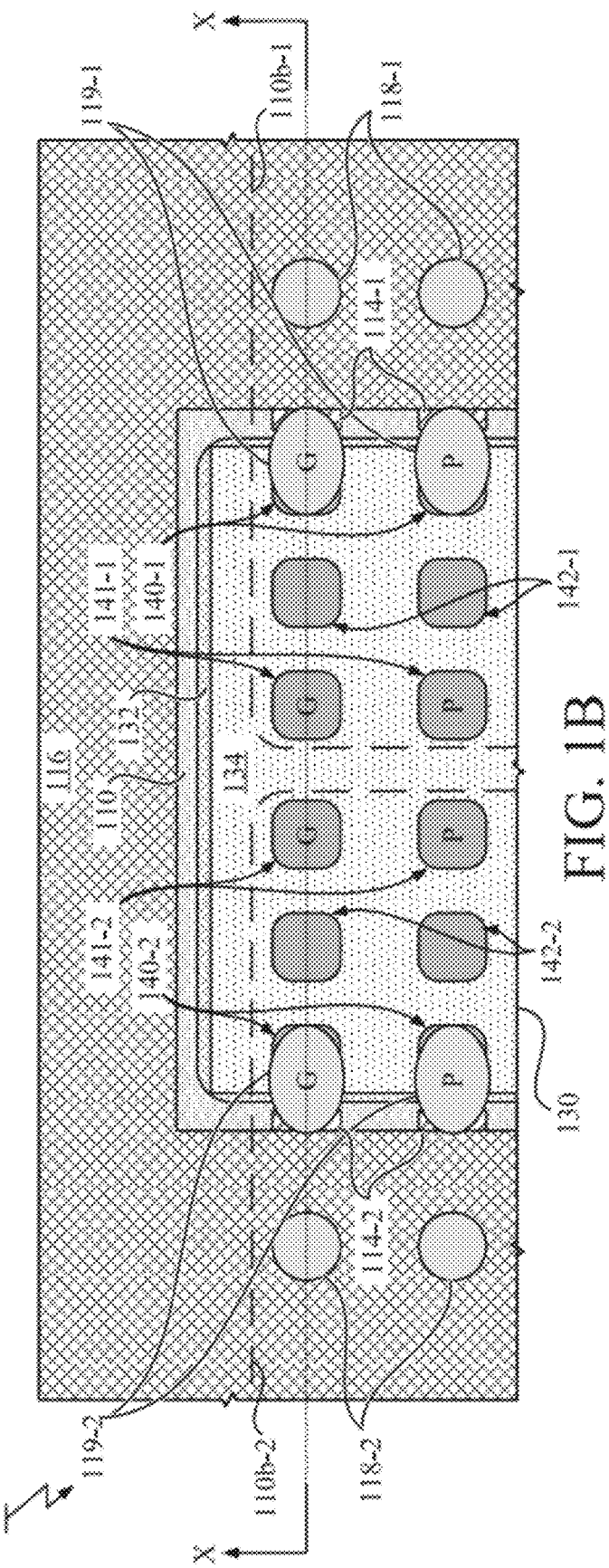
FIG. 1A
FIG. 1B

US 11,574,817 B2

FABRICATING AN INTERCONNECTION USING A SACRIFICIAL LAYER

BACKGROUND

The present disclosure generally relates to interconnection technology and, more particularly, to an interconnection structure, an interconnection layer carrying structure, and methods of fabricating thereof.

In response to a growing demand for wide band signal transmission between chips (or dice), several technologies targeting high-density interconnections between chips have been proposed.

Interconnection structures using an interconnection member attached to or embedded in an organic substrate have been developed for establishing interconnections between chips mounted thereon. Examples of such interconnection members disposed on the organic substrate include a silicon bridge and an organic layered interconnection. The use of such interconnection members can often restrict the routing of wiring for connecting chips and for driving the chips. The terminal layout of the chips can also be restricted. For example, even though it may be preferable to arrange the ground and power supply terminals of the chip at positions above the interconnection member, it can be difficult to route wiring from the power and ground terminals of the chip to the external power supply and ground lines of the organic substrate.

SUMMARY

Embodiments of the present disclosure include a method for fabricating an interconnection layer carrying structure. A carrier can be provided. An organic layer can be deposited on the carrier, wherein the organic layer includes a multi-layer wiring structure therein, and the uppermost surface is covered with an organic top layer. A sacrificial layer can be deposited on the organic top layer. The carrier and the organic layer can be diced together with the sacrificial layer.

Embodiments of the present disclosure further include a method for fabricating an interconnection layer carrying structure. A support substrate can be provided. A release layer can be formed on the support substrate. A set of pads can be formed on the release layer. The set of pads can be connected using a conductive material. At least one organic layer can be deposited over the set of pads. A sacrificial layer can be deposited over the at least one organic layer. The support substrate, release layer, and the at least one organic layer can be diced together with the sacrificial layer.

Embodiments of the present disclosure further include an interconnection layer carrying structure. The interconnection layer carrying structure can include a support substrate, a release layer deposited on the support substrate, and a set of pads deposited on the release layer. The set of pads can be connected using a conductive material. The interconnection layer carrying structure can include at least one organic layer deposited over the set of pads. The interconnection layer carrying structure can include a sacrificial layer deposited over the at least one organic layer, wherein the support substrate, release layer, and the at least one organic are diced together with the sacrificial layer.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure. The foregoing and other features and advantages are apparent from the following detailed description taken in conjunction with the accompanying drawings. Note that the sizes and relative positions of elements and layers in the drawings are not necessarily drawn to scale. Some of these elements or layers are arbitrarily enlarged and positioned to improve the legibility of drawing.

FIG. 1A illustrates a schematic of an interconnection substrate according to an exemplary embodiment of the present disclosure.

FIG. 1B illustrates a schematic of an interconnection substrate according to an exemplary embodiment of the present disclosure.

Figure 2:
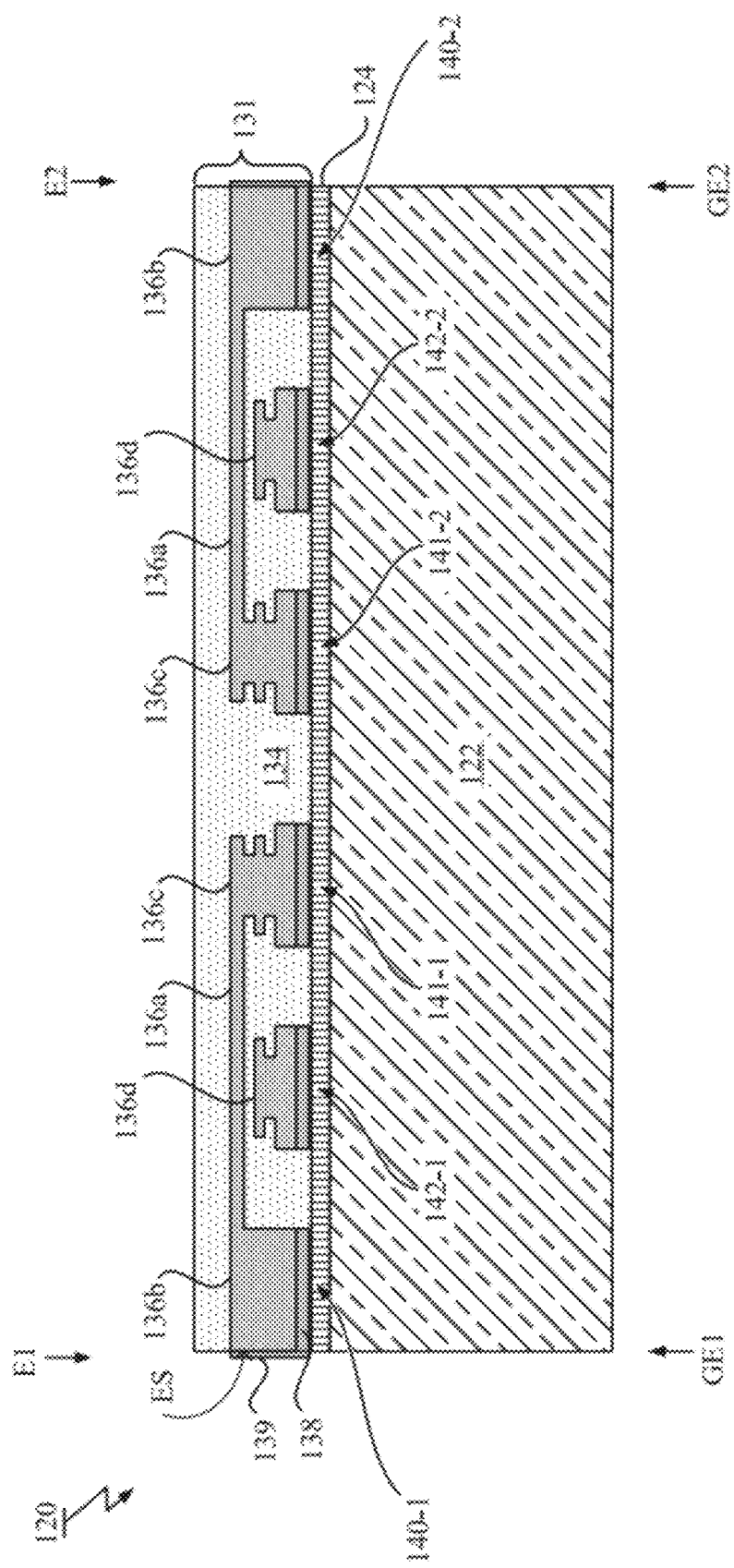
FIG. 2 illustrates a schematic of an interconnection layer carrying structure used for transferring an interconnection layer onto a target substrate according to an exemplary embodiment of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure generally relate to interconnection technology and, more particularly, to an interconnection structure, an interconnection layer carrying structure, and methods of fabricating thereof. While the present disclosure is not necessarily limited to such applications, various aspects of the disclosure can be appreciated through a discussion of various examples using this context.

One or more embodiments according to the present disclosure are directed to an interconnection structure, an interconnection layer carrying structure used for fabricating the interconnection structure, a method of fabricating the interconnection structure, and a method of fabricating the interconnection layer carrying structure, in which the interconnection structure provides side connections between a base substrate and an interconnection layer disposed thereon in addition to high-density interconnections between chips mounted on the interconnection structure. When describing embodiments with reference to FIGS. 1A through 22B, a plurality of identical elements may be identified with a collective reference numeral, while each individual element of the plurality may be identified by an individual index reference numeral appended to the collective reference numeral, for example, a plurality of bond pads shown in FIG. 1A are collectively referenced by numeral 112, and each individual bond pad is referenced by numeral 112-1 and 112-2.

Hereinafter, referring to FIG. 1A and FIG. 1B, a schematic of an interconnection structure before chip mounting according to an exemplary embodiment of the present disclosure is described.

FIG. 1A and FIG. 1B illustrate a schematic of an interconnection substrate 100 for interconnecting chips to be mounted thereon. The interconnection substrate 100 is an interconnection structure before the chip mounting. FIG. 1A and FIG. 1B show a cross-sectional view and a top view of the interconnection substrate 100, respectively. Note that the cross-sectional view shown in FIG. 1A corresponds to a cross-section indicated by "X" in the top view of FIG. 1B.

As shown in FIG. 1A, the interconnection substrate 100 includes an organic base substrate 110; a plurality of bond pads 112 used for chip bonding that is formed on the organic base substrate 110; a set of conductive pads 114 used for side connection that is formed on the organic base substrate 110; and an interconnection layer 130 disposed on the organic base substrate 110.

The organic base substrate 110 can be a build-up substrate having a core such as a glass epoxy core and an appropriate number of wiring layers with interlayer dielectrics, and can be fabricated by any build-up process. The bond pads 112 and the conductive pads 114 can be an outermost layer of the build-up substrate. Each bond pad 112 is connected to a signal line via the wiring in the organic base substrate 110. Each conductive pad 114 is connected to a power supply or ground line that can work as a signal return current path, which is a path the current takes to return to the source, via the wiring in the organic base substrate 110. The bond pads 112, the conductive pads 114, and wiring are made of any one of metal materials (e.g., Cu, Al, etc.) and other conductive materials. In embodiments, metal copper can be used. Note that an internal structure inside the organic base substrate 110 is omitted from the drawings for the purpose of illustration. Also, note that the organic base substrate 110 is employed as a base substrate in the described embodiment. However, an inorganic substrate such as a glass substrate can also be employed as the base substrate.

In embodiments, the interconnection substrate 100 also includes a solder resist layer 116 formed on the organic base substrate 110. Each bond pad 112 can be covered by the solder resist layer 116 and exposed from the solder resist layer 116 through an opening formed therein. Each bond pad 112 can have a pre-solder 118 formed within the opening of the solder resist layer 116. Additionally, each conductive pad 114 can be covered by the solder resist layer 116 in part and exposed from the solder resist layer 116 at one edge close to the interconnection layer 130 disposed on the organic base substrate 110. The thickness of the pads 112, 114 can typically range from 1 to 20 micrometers. The thickness of the solder resist layer 116 can be in the range of its adequate film thickness and can range from 2 to 50 micrometers. Note that the solder resist layer 116 that is generally organic material is used as an insulation layer disposed on the organic base substrate 110. However, instead of using the solder resist layer 116, a dielectric layer of insulation material such as inorganic insulation material other than solder mask material can also be contemplated.

The plurality of the bond pads 112 can be divided into a plurality of groups. One group of bond pads (hereinafter referred to as a first group) 112-1 are positioned at a flip-chip area (referred to as a first flip-chip area) 110b-1 on the interconnection substrate 100. Another group of bond pads (hereinafter, referred to as a second group) 112-2 are positioned at a different flip-chip area (referred to as a second flip-chip area) 110b-2 on the interconnection substrate 100. The second group of the bond pads 112-2 can be located at a distance from the first group of the bond pads 112-1. Note that the pre-solders 118-1, 118-2 formed on the bond pads 112-1, 112-2 are depicted in the top view of FIG. 1B. The first and the second flip-chip areas 110b-1, 110b-2 are areas where one chip (hereinafter, referred to as a first chip) and another chip (hereinafter, referred to as a second chip) would be mounted after subsequent chip mounting process, respectively.

The interconnection layer 130 is disposed on the top surface of the organic base substrate 110 and located within a defined area 110a between the first and second groups of the bond pads 112-1, 112-2. The defined area 110a where the interconnection layer 130 is disposed has no solder resist. The interconnection layer 130 can be positioned at the defined area 110a by using an appropriate alignment mark and attached to the organic base substrate 110. Note that the defined area 110a for the interconnection layer 130 overlaps with both of the first and the second flip-chip areas 110b-1, 110b-2 in part. Also, the defined area 110a where the interconnection layer 130 is disposed can be recessed to adjust the levels of the top surface of the interconnection layer 130, and the top surface of the solder resist layer 116.

The interconnection layer 130 is bonded to the top surface of the organic base substrate 110 by an adhesive 132. A paste or liquid type or a film type adhesive material can be used for the adhesive 132.

Further referring to FIG. 1A, the structure of the interconnection layer 130 is depicted in more detail. The interconnection layer 130 includes an organic insulation material 134; a conductive pattern 136 embedded in the organic insulation material 134; and a plurality of pads 140-142 exposed at the top surface 130a of the interconnection layer 130, which can be provided by the organic insulation material 134. The pads 140-142 of the interconnection layer 130 are divided into two types. The first type is side connection pads 140 used for the side connection, and the second type is bond pads 141, 142 used for the chip bonding.

Note that the organic insulation material 134 is employed as insulation material for the interconnection layer 130 in the described embodiment. The organic material can be advantageous in instances where the organic base substrate 110 is employed in order to alleviate the coefficient of thermal expansion (CTE) mismatch between the interconnection layer 130 and the organic base substrate 110, which can be used as a package substrate. However, the insulation material is not limited to organic material. In other embodiments, inorganic insulation material can also be employed as the insulation material.

In the described embodiment, as representatively described for the first flip-chip area 110b-1, the interconnection layer 130 has an edge E1 located next to the sets of the conductive pads 114-1, and an edge E2 located next to the sets of the conductive pads 114-2, disposed on the organic base substrate 110. The set of the side connection pads 140-1 is located and exposed at the edge E1. Each side connection pad 140-1 is arranged with respect to a corresponding one of the conductive pads 114-1 disposed on the organic base substrate 110. When the set of the conductive pads 114-1 is arranged in a line along one edge close to the interconnection layer 130 with a predetermined interval (e.g., pitch width), the set of the side connection pads 140-1 is also arranged in a line along the edge E1 of the interconnection layer 130 with a predetermined interval (e.g., pitch width) that matches the interval of the conductive pads 114-1. Although there is no particular limitation, in embodiments, the side connection pads 140-1 and the conductive pads 114-1 have a one-to-one relationship.

Each side connection pad 140 has a top surface TS exposed at the top surface 130a of the interconnection layer 130 and an edge surface ES exposed at one edge (e.g., E1) of the interconnection layer 130. The top surface TS is parallel to the top surface of the organic base substrate 110, whereas the edge surface ES is perpendicular to the top surface of the organic base substrate 110 and is oriented toward the corresponding one of the conductive pads 114. In embodiments, the edge surface ES and/or the top surface TS of each side connection pad 140 have a barrier metal layer. Examples of the barrier metal layer include a stack of Au/Pd/Ni and a stack of Au/Ni where the first element (e.g., Au for both cases) is the top in the stack (in descending order of depth). Note that symbols such as Au, Pd, Ni, and the like represent a main element contained in each layer of the stack, which can contain a trace amount of other elements to form alloy and/or can also contain a small or trace amount of additives due to the manufacturing process. Also, note that each of the bond pads 112 and the conductive pads 114 disposed on the organic base substrate 110 may or may not have a similar barrier metal layer.

As shown in FIG. 1A and FIG. 1B, the interconnection substrate 100 can also include a set of solder joints 119, each of which connects one side connection pad 140 of the interconnection layer 130 with one corresponding conductive pad 114 disposed on the organic base substrate 110. Each solder joint 119 contacts exposed surfaces of the side connection pad 140 (the top surface TS and the edge surface ES) and the conductive pad 114. Note that the solder joints 119-1, 119-2 formed on the conductive pads 114-1, 114-2, and the side connection pads 140-1, 140-2 are also depicted in the top view of FIG. 1B. A symbol 'G' denotes a ground, whereas a symbol 'P' denotes a power supply.

In the described embodiment, the pads 112, 114, and the substrate have respective surfaces (pad surfaces PS of the conductive pads 114 and the bond pads 112 and a substrate surface SS around the conductive pads 114 and the bond pads 112) to which a surface treatment for enhancing surface roughness has been applied. In embodiments, the surface treatment includes sandblasting and/or a plasma treatment. Hence, the conductive pad 114 has a pad surface PS that is exposed from the substrate surface SS and is rougher than exposed surfaces of untreated pads. The bond pad 112 also has a pad surface PS exposed from the substrate surface SS and is rougher than exposed surfaces of untreated pads. Also, the substrate has a part of the substrate surface SS close to the conductive pads 114 and the bond pads 112 that is rougher than other parts of the substrate surface.

Note that the substrate surface SS is defined as a surface of a part that includes the organic base substrate 110 as a substrate body and the solder resist layer 116 formed on the substrate body. The substrate surface SS can include a top surface of the solder resist layer 116, a top surface of the organic base substrate 110 where there is no solder resist, no interconnection layer and no adhesive, and/or a surface of the adhesive 132 at least in part.

The substrate surface SS can be provided by organic material of the solder resist layer 116, the organic base substrate 110, and/or the adhesive 132 and can have low wettability for molten solder. The pad surface PS of each of the conductive pads 114 and the bond pads 112 can have high wettability for molten solder. In the context of the present disclosure, the term 'low wettability' means that the surface has a contact angle greater than 90 degrees ($90°<\theta<180°$), whereas the term 'high wettability' means that the surface has a contact angle less than 90 degrees ($0<\theta<90°$). The contact angle ($\theta$) is an angle at which a liquid-air interface meets a solid-liquid interface where the liquid is the molten solder and the solid is the conductive material of the pad 112, 114 or the organic material of the substrate, and provides an inverse measure of wettability.

In embodiments, the part of the substrate surface SS after application of the surface treatment has a roughness parameter (Ra) greater than 0.4 μm and lower than 2 μm, more preferably greater than 0.5 μm and lower than 1 μm, as long as the thickness of the solder resist layers after the surface treatment is kept sufficiently constant, where Ra represents an average roughness. In terms of another roughness parameter (Rq), the part of the substrate surface SS can have a roughness parameter (Rq) greater than 700 nm and lower than 4 μm, more preferably greater than 0.8 μm, and lower than 2 μm, where Rq represents the root mean squared roughness. The same can hold for the pad surface PS.

Further note that each of the pads 140, 141, 142 of the interconnection layer 130 also can have a pad surface exposed from the top surface 130a of the interconnection layer 130 and rougher than the exposed surface of other untreated pads to which no surface treatment for enhancing surface roughness is applied. Also, the top surface 130a of the interconnection layer 130 can have a part close to the pads 140, 141, 142 rougher than other parts of the interconnection layers 130, to which no surface treatment for enhancing surface roughness is applied.

In the described embodiment, as representatively described for the first flip-chip area 110b-1, the side connection pads 140-1, the conductive pad 114-1, and accordingly, the solder joints 119-1 are located within the flip-chip area 110b-1. The same holds for the other flip-chip area 110b-2. However, positions of the side connections (the side connection pads 140, the conductive pads 114, and the solder joints 119) are not limited. In other embodiments, the side connections are placed at positions away from the flip-chip areas 110b since the side connections are not involved directly in the chip bonding.

Here, focusing again on the structure of the interconnection layer 130, the bond pads 141, 142 are exposed from the organic insulation material 134 at the top surface 130a of the interconnection layer 130. The bond pads 141, 142 of the interconnection layer 130 are used for mounting chips disposed thereon in conjunction with the bond pads 112 disposed on the organic base substrate 110. In the described embodiment, the bond pads 141, 142 of the interconnection layer 130 are functionally divided into two types. A first type is a first bond pad 141 used for power supply or ground and a second type is a second bond pad 142 used for signal transmission between the chips.

Each first bond pad 141 used for the power supply or ground is connected, via wiring (which is a part of the conductive pattern 136) embedded in the organic insulation material 134, to a corresponding side connection pad 140 that is further connected to the power supply or ground line of the organic base substrate 110 through the solder joint 119.

The bond pads 141, 142 of the interconnection layer 130 are also divided into a plurality of groups in terms of connection partner. One group of bond pads (hereinafter, referred to as a first set) 141-1, 142-1 are positioned at the first flip-chip area 110b-1 and the other group of bond pads (hereinafter, referred to as a second set) 141-2, 142-2 are positioned at the second flip-chip area 110b-2. Although not shown in FIG. 1A, one bond pad 142-1 in the first set is electrically connected to a corresponding bond pad 142-2 in the second set by wiring or a trace (which is also a part of the conductive pattern 136) embedded into the organic insulation material 134. Note that conductive pattern 136 can include a plurality of conductive layers with one or more interlayers of the organic insulation material, in which parts of adjacent conductive layers are connected by a conductive via formed through the interlayer. Also, the conductive pattern 136 includes a plurality of electrical paths isolated by the organic insulation material.

In FIG. 1A, it is described that the bond pad 141-1 is connected to the side connection pad 140-1 that is located within the same flip chip area 110b-1 and not connected to other side connection pad 140-2 located within the different flip chip area 110b-2. However, since the power supply and the ground can be shared between the plural chips, the power supply or ground line for the first chip can be connected to the same line for the second chip.

In an effort to simplify the description of the embodiment, four bond pads 141, 142, two solder joints 119 (two side connection pads 140 and two conductive pads 114), and two bond pads 112 of the organic base substrate 110 for each chip are shown in FIG. 1B. However, the number of bond pads, the number of the solder joints (hence, the number of side connection pads and the number of conductive pads), and the number of the bond pads of the organic base substrate 110 for each chip are not limited and can depend on the specification of the chip. Also, the number of flip chip areas is not limited to two.

As described later, the first set of the bond pads 141-1 142-1 of the interconnection layer 130 and the first group of the bond pads 112-1 of the organic base substrate 110 are formed in a 2-dimensional array and configured to receive terminal bumps of the first chip. The same holds for other chips.

In the described embodiment, the interconnection layer 130 shown in FIG. 1 can be attached to the organic base substrate 110 by using a novel interconnection layer carrying structure. Hereinafter, referring to FIG. 2, an interconnection layer carrying structure 120 used for transferring an interconnection layer onto a target substrate according to an exemplary embodiment of the present disclosure is described.

FIG. 2 illustrates a schematic of an interconnection layer carrying structure that can be used for transferring an interconnection layer 130 onto the organic base substrate 110 to fabricate the interconnection substrate 100 shown in FIGS. 1A and 1B. The view shown in FIG. 2 is a cross-sectional view of the interconnection layer carrying structure 120.

As shown in FIG. 2, the interconnection layer carrying structure 120 includes a support substrate 122; a release layer 124 formed on the support substrate 122; and an interconnection layer part 131 formed on the release layer 124. The interconnection layer part 131 shown in FIG. 2 corresponds to the interconnection layer 130 shown in FIG. 1 and is illustrated with its top and bottom surfaces being faced upside-down with respect to the view shown in FIG. 1A.

The support substrate 122 can be a rigid and stable substrate used to fabricate the interconnection layer part 131 thereon. The support substrate 122 can suitably be any substrate as long as it provides adequate rigidity and stability. In one or more embodiments, the support substrate 122 can be an inorganic substrate including glass, semiconductor such as silicon, ceramic, etc. In embodiments, the support substrate 122 is a glass substrate since the glass substrate has transparency and thermal expansion coefficient (CTE) (3-12 ppm/degrees Celsius) closer to that of organic material used to build the interconnection layer part 131 in comparison with a silicon substrate, for example. Examples of such glass substrate can include soda lime glass, borosilicate glass, fused silica, synthetic quartz glass, to name but a few.

The release layer 124 is a release coating configured to release the interconnection layer part 131 from the support substrate 122 by appropriate treatment. When the support substrate 122 has transparency, UV (ultraviolet)/IR (infrared)/visible light can be irradiated to the release layer 124 from the back side of the support substrate 122 so as to release the interconnection layer part 131 from the support substrate 122.

In embodiments, the release layer 124 can be any known light-sensitive release layer that allows de-bonding from the support substrate interface with laser illumination in the field of wafer bonding/de-bonding technology. In embodiments, a light-to-heat conversion release coating, which converts absorbed light energy to heat, can be used as the release layer 124. In these embodiments, the release layer 124 can be burned, broken down, or decomposed by ablating the release layer 124 using laser illumination after the interconnection layer part 131 is fixed to the organic base substrate 110. In other embodiments, the release layer 124 can be a thermal or UV-releasable adhesive layer whose adhesive property disappears or degrades by heat or UV irradiation. Residual of the release layer 124 can be cleaned after release if necessary. In embodiments, any of the known de-bonding methods, including a mechanical peel-off method, a thermal slide-off method, and a solvent release method, can be employed.

As described by referring to FIGS. 1A and 1B, the interconnection layer part 131 includes the organic insulation material 134; the plurality of the pads 140-142 that face towards the support substrate 122 and are embedded in the organic insulation material 134; the plurality of the traces (or wiring) 136a-136d embedded in the organic insulation material 134.

Although not shown in FIG. 2, in embodiments where the film type adhesive material is used for the adhesive 132 in FIG. 1, the interconnection layer part 131 can further include an adhesive layer that is formed on a top of the organic insulation material 134 and can fully cover the top surface of the organic insulation material 134.

The plurality of the pads 140-142 include the side connection pads 140, the first bond pads 141 for power supply or ground, and the second bond pads 142 for signal transmission. Each side connection pad 140 is configured to be connected, by a solder joint 119, to a corresponding conductive pad 114 disposed on the organic base substrate 110, to which the interconnection layer part 131 is transferred, as shown in FIG. 1. The plurality of the pads 140-142 are divided into a plurality of groups, including the first set of the pads 140-1, 141-1, 142-1, and the second set of the pads 140-2, 141-2, 142-2. Each pair of the side connection pad 140-1 and the corresponding bond pad 142-1 is electrically coupled by the traces 136a. Each pair of the bond pad 142-1 and the corresponding bond pad 142-2 is electrically coupled by a trace (the trace for connecting the bond pads 142-1, 142-2 is not shown in FIG. 2).

The organic insulation material 134 can be disposed on the release layer 124. In the described embodiment, the top surface of the organic insulation material 134 can be flat and bare surface. In other embodiments, the top surface of the organic insulation material 134 can be covered by an adhesive layer. The pads 140-142 can be exposed at a bottom surface from the organic insulation material 134 and in touch with the release layer 124. In the described embodiment, each pad 140-142 includes a barrier metal layer 138 formed on the release layer 124. Each pad 140-142 can further include a seed metal layer, which can be used to deposit conductive material (e.g., the barrier metal layer 138 and a pad body) at a bottom surface thereof (corresponding to the top surface TS) on the release layer 124 by electrolytic plating. In embodiments, each side connection pad 140 further includes a barrier metal layer 139 formed at the edge surface ES thereof.

The organic insulation material 134 can be any suitable photosensitive insulating resin such as PI (polyimide), BCB (benzocyclobutene), PBO (polybenzoxazole), or other photosensitive polymers. Use of the organic insulation material can alleviate CTE mismatch between the interconnection layer 130 and the organic base substrate 110. The conductive pattern 136 can be made of any one of metal materials (e.g., Cu, Al, etc.) and other conductive materials. In embodiments, metal copper can be used for the conductive pattern 136. The barrier metal layer 138, 139 can be, but is not limited to, a stack of Au/Pd/Ni or a stack of Au/Ni where the first element (e.g., Au for both cases) is the bottom layer in the stack in FIG. 2.

In the described embodiment, the edges E1, E2 of the interconnection layer part 131 are aligned with the edges GE1, GE2 of the support substrate 122. As shown in FIG. 2, the interconnection layer part 131 is provided as being fabricated on the support substrate 122 in the form of tape that is formed by organic material and held by the support substrate 122 as a rigid backing material. A process to fabricate the interconnection layer carrying structure 120 will be described later.

Hereinafter, referring to a series of FIGS. 3A-3C and FIGS. 4A-4C, a process for fabricating an interconnection substrate 100 by using an interconnection layer carrying structure 120 according to an exemplary embodiment of the present disclosure, is described. FIGS. 3A-3B and FIGS. 4A-4C illustrate cross-sectional views of structures obtained during the fabrication process of the interconnection substrate 100.

Figure 3A:
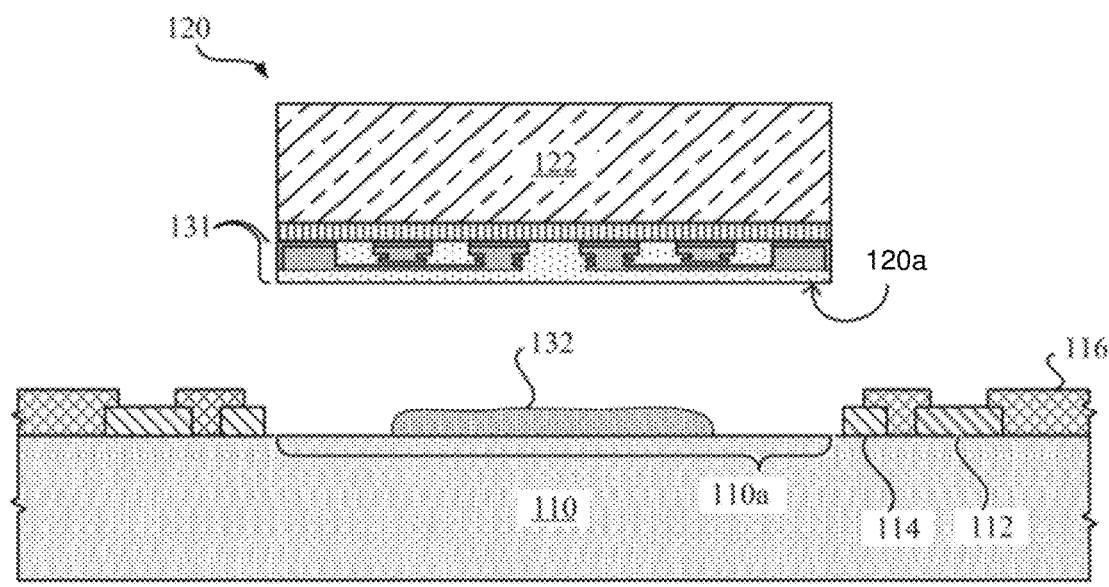
FIG. 3A illustrates a cross-sectional view of structures obtained during a fabrication process of the interconnection substrate using the interconnection layer carrying structure according to an exemplary embodiment of the present disclosure.

As shown in FIG. 3A, the fabrication process of the interconnection substrate 100 can include providing the organic base substrate 110 and the interconnection layer carrying structure 120. The organic base substrate 110 prepared by this step can include the plurality of the bond pads 112, the set of the conductive pads 114, and the solder resist layer 116 disposed on the organic base substrate 110. Note that there is a defined area 110a on the organic base substrate 110 where no solder resist layer is present.

As shown in FIG. 3A, the fabrication process can further include applying an adhesive 132 onto the organic base substrate 110 within the defined area 110a. In the described embodiment, a paste or liquid type adhesive material, which can be used as an underfill when bonding chips with substrates, is used for the adhesive 132. Use of the paste or liquid type adhesive can prevent the occurrence of voids in the adhesive 132. However, in embodiments where an adhesive of film type adhesive material is formed on a top of the interconnection layer part 131, applying the adhesive can be omitted.

Figure 3B:
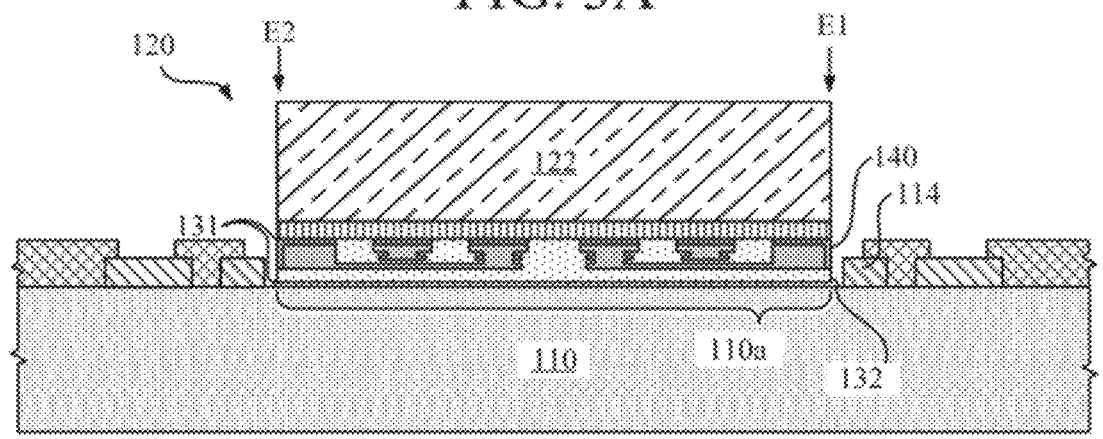
FIG. 3B illustrates a cross-sectional view of structures obtained during a fabrication process of the interconnection substrate using the interconnection layer carrying structure according to an exemplary embodiment of the present disclosure.

As shown in FIG. 3B, the fabrication process can include placing the interconnection layer carrying structure 120 onto the organic base substrate 110 such that the edges E1, E2 of the interconnection layer part 131 are located next to the respective sets of the conductive pads 114 and each side connection pad 140 is arranged with respect to a corresponding one of the conductive pads 114 disposed on the organic base substrate 110. The interconnection layer carrying structure 120 can be placed onto the organic base substrate 110 by using a bonder in an upside-down manner such that the pads 140-142 face up and the bare surface of the organic insulation material 134 face down. The bottom of the organic insulation material 134 is attached to the top surface of the organic base substrate 110 within the defined area 110a.

Since the bond pads 141, 142 of the interconnection layer part 131 and the bond pads 112 on the organic base substrate 110 are configured to receive bumps of chips to be mounted, the interconnection layer carrying structure 120 can be positioned at the defined area 110a by using an appropriate alignment mark that can be formed on the organic base substrate 110 in advance. The fabrication process can further include curing the adhesive 132 so as to firmly bond the interconnection layer part 131 to the organic base substrate 110 after placing the interconnection layer carrying structure 120 onto the organic base substrate 110.

In other embodiments, applying the adhesive 132 can be performed after the placement of the interconnection layer carrying structure 120 by way of a capillary or an injection flow method.

Figure 3C:
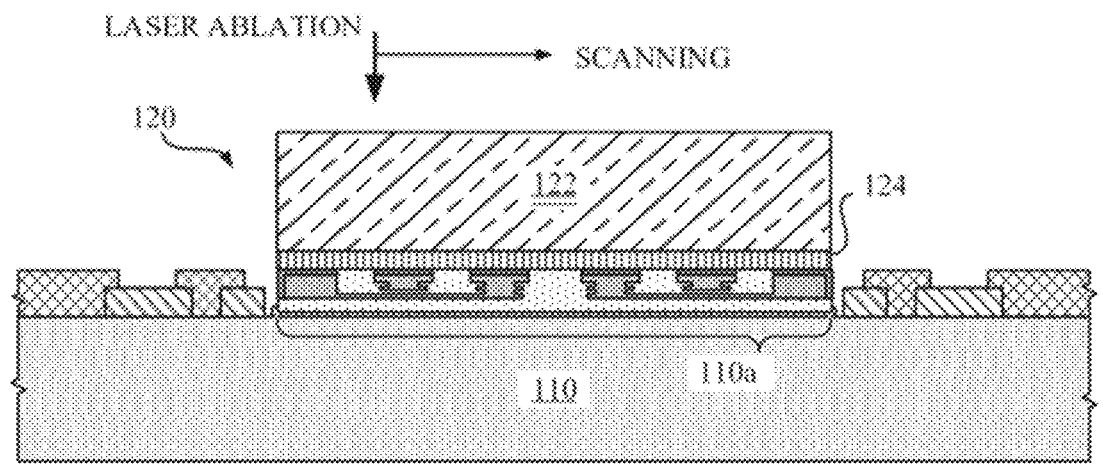
FIG. 3C illustrates a cross-sectional view of structures obtained during a fabrication process of the interconnection substrate using the interconnection layer carrying structure according to an exemplary embodiment of the present disclosure.

As shown in FIG. 3C, the fabrication process can include releasing the interconnection layer part 131 from the support substrate 122 by removing the release layer 124. In embodiments, the support substrate 122 has transparency, and releasing from the support substrate 122 can be completed by ablating the release layer 124 with laser illumination through the support substrate 122 while scanning the laser beam.

By performing the aforementioned steps, the interconnection layer part 131 is transferred from the interconnection layer carrying structure 120 to the organic base substrate 110 at the defined area 110a to obtain an interconnection layer 130 attached to the organic base substrate 110. The releasing step shown in FIG. 3C leaves the interconnection layer 130 on the organic base substrate 110 such that the set of the pads 140-142 faces in a direction opposite to the organic base substrate 110.

Figure 4A:
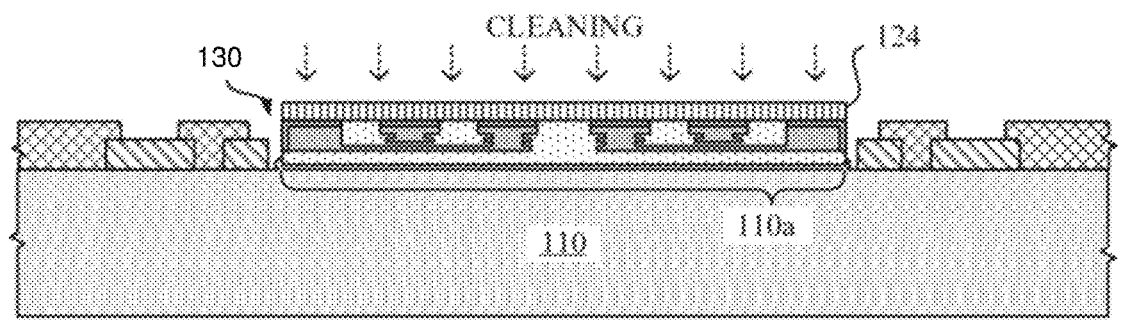
FIG. 4A illustrates a cross-sectional view of structures obtained during the fabrication process of the interconnection substrate using the interconnection layer carrying structure according to the exemplary embodiment of the present disclosure.

As shown in FIG. 4A, the fabrication process can also include cleaning of residuals on a top of the interconnection layer 130, which can include residuals of the release layer 124 after removing the release layer 124. The cleaning of the residuals can be performed by any suitable means, including $O_2$ plasma irradiation. In embodiments, the fabrication process can also include performing an etching of surfaces of the pads 140-142, which can include a seed metal layer formed on the pads 140-142, to expose the bare surface of the metal stack 138, after removing the release layer 124.

Figure 4B:
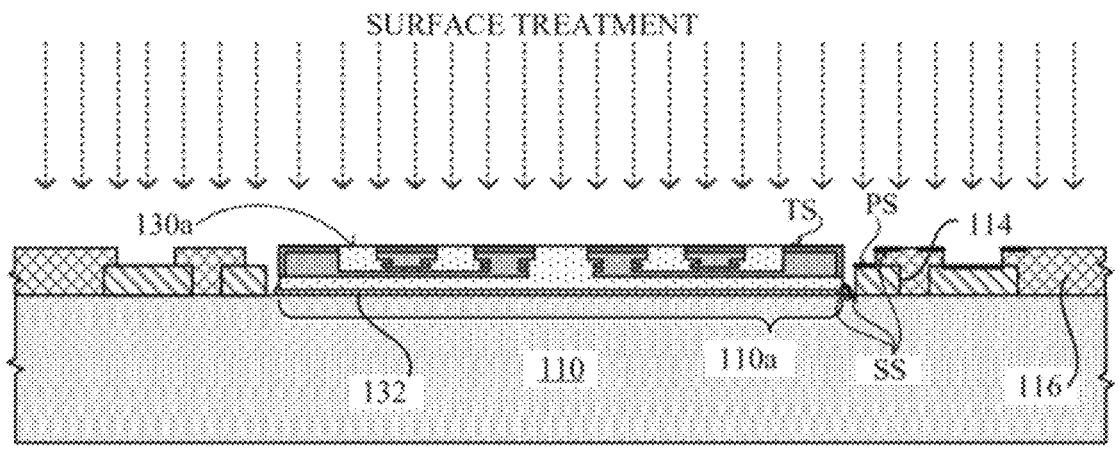
FIG. 4B illustrates a cross-sectional view of structures obtained during the fabrication process of the interconnection substrate using the interconnection layer carrying structure according to the exemplary embodiment of the present disclosure.

As shown in FIG. 4B, the fabrication process can include applying a surface treatment for enhancing surface roughness to exposed pad surfaces PS of the conductive pads 114 and the bond pad 112 and a part of the exposed substrate surface SS around the conductive pads 114 and the bond pad 112. Examples of such surface treatment for enhancing surface roughness include sandblasting (abrasive blasting) and plasma treatment.

In embodiments, sandblasting is employed as the surface treatment. Sandblasting can be completed by using an appropriate abrasive media of a particle size under an appropriate condition, such as the collision speed of the abrasive media. There are many types, such as, for example, dry blasting and wet blasting. Wet blasting, in which the abrasive media and the liquid such as water are applied to a work piece, may be used due to its ability to use finer abrasive media than the dry blasting. Sandblasting can be used since sandblasting modifies the exposed surfaces mechanically and physically without affecting chemical surface conditions significantly. Also, it is possible to control the roughness of the exposed surfaces more precisely, with a wider control range, by using appropriate abrasive particles.

In embodiments, plasma treatment can be employed as the surface treatment. The plasma treatment can use Argon (Ar) plasma, Oxygen ($O_2$) plasma, and/or a mixture thereof. The plasma treatment using Ar plasma can be employed because Ar plasma can prevent oxidation. However, $O_2$ plasma treatment is also contemplated in cases where the pads 112, 114 are protected by precious metal layers such as an Au layer formed on the top. The plasma treatment can be completed under an appropriate condition, which can include RF (radio frequency) power, accelerating voltage, the flow rate of gas, application time, etc., such that sufficient enhancement of surface roughness is obtained.

Although plasma treatments are often applied to a target surface to remove organic residue to clean the surface and/or to functionalize the surface for modifying surface characteristic chemically, the plasma treatment according to the exemplary embodiment is different from such plasma treatment for cleaning and/or surface functionalization in terms of the aim and the conditions. Generally, in order to make the target surface sufficiently rougher, the plasma treatment is applied for a relatively extended duration. Also, the plasma treatment for enhancing the surface roughness could physically roughen the surface, and the roughening effect can persist for a relatively long time. In contrast, the effectiveness of the plasma treatment in terms of cleaning and/or surface functionalization may be short since the cleaned surface tends to be contaminated over time and the surface condition changes over time. Hence the cleaning/functionalization effect decays with time. Also, since the plasma treatment, especially $O_2$ plasma treatment, can make the resin surface more hydrophilic due to interaction between active species and the surface molecules, it may be preferable to maintain the exposed surface of the solder resist layer 116 after the plasma treatment until the hydrophilicity decays sufficiently.

Enhancement of the surface roughness improves solder wettability of a surface having high wettability while improving de-wettability of a surface having low wettability. The wettability of molten solder depends on the surface roughness of the solid components when the material of three phases is identical. The wettability is represented by contact angle in Wenzel's equation as follows:

$$\cos \theta_w = r \cos \theta, \quad \text{Equation 1}$$

where $\theta_w$ denote an apparent contact angle, $\theta$ denotes a Young's contact angle, and r represents a roughness ratio (r=1 for smooth surface and r>1 for rough surface).

When the surface irregularities are so fine that air remains at the interface and forms a chemically heterogeneous surface, Cassie equation holds as follows:

$$\cos \theta_c' = f \cos \theta_a + (1-f) \cos \theta_b,$$

where f denotes a ratio of area contacting the liquid and solid phases, $\theta_a$ denotes a contact angle for component A with a fractional surface area f and $\theta_b$ denotes a contact angle for components B with a remaining fractional surface area (1−f). When the liquid contacts the air (e.g., $\theta_b$=180 degrees), The Cassie equation is as follows:

$$\cos \theta_c' = f \cos \theta_a + 1 - f.$$

Hence, the contact angle $\theta_c'$ increases even if the interface between the solid and liquid includes the air. When f=1 and the surface returns to homogeneity, Wenzel's equation holds.

The application of the surface treatment modifies both of different wetting characteristics of the exposed surfaces in respective strengthening directions. The substrate surface SS with the low wettability (90 degree<$\theta$<180 degrees) becomes more non-wettable ($\theta_w$>$\theta$). Simultaneously, the pad surface PS with the high wettability (0<$\theta$<90 degrees) becomes more wettable ($\theta_w$<$\theta$). The enhancement of the surface roughness improves solder wettability of the exposed pad surface PS of the pads 114 having high wettability while improving de-wettability of the substrate surface SS having low wettability. Thereby, it is possible to prevent adjacent side connections from bridging when soldering, and improve the reliability of the side connections as well as chip bonds even if the pitch widths between the side connections and bonds are fine.

The surface treatment for enhancing the surface roughness can be performed after releasing the interconnection layer part 131 from the support substrate 122. In this embodiment, the surface of the pads 140, 141, 142 (including the top surface TS (and possibly the edge surface ES) of the side connection pad 140) and at least a part of the top surface 130a of the interconnection layer 130 close to the pads 140, 141, 142 can also be subjected to the surface treatment.

Figure 4C:
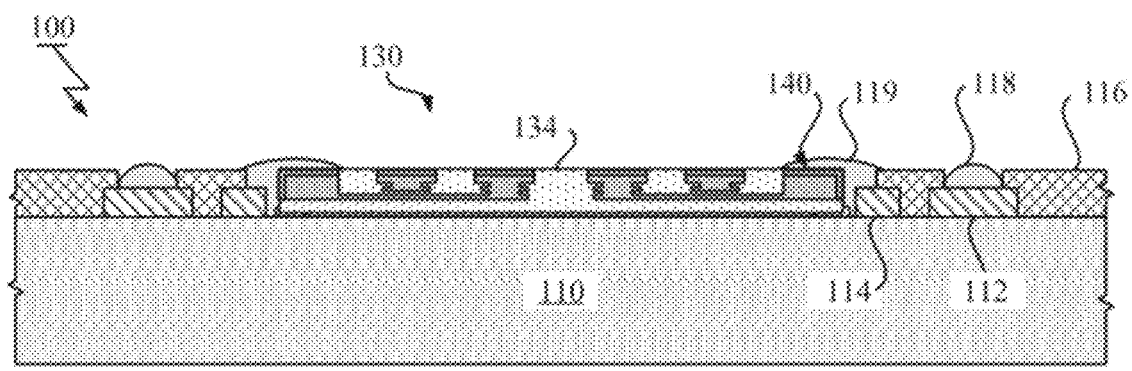
FIG. 4C illustrates a cross-sectional view of structures obtained during the fabrication process of the interconnection substrate using the interconnection layer carrying structure according to the exemplary embodiment of the present disclosure.

As shown in FIG. 4C, the fabrication process can include forming a set of solder joints 119 to connect the side connection pads 140 of the interconnection layer 130 with the corresponding conductive pads 114 disposed on the organic base substrate 110, respectively. A set of pre-solders 118 can also be formed by this step. Each solder joint 119 can be formed by applying solder paste onto the side connection pads 140 and the corresponding conductive pads 114 and by heating to melt the solder paste to form mechanical and electrical joints. The paste can be applied by jet printing, stencil printing, or syringe. In an alternative embodiment, injection molten soldering (IMS) can be employed to form the solder joints 119. The IMS technology is advantageous when a larger volume of solder is preferable.

In the described embodiment, heating the solder paste to form the set of the solder joints 119 is completed before the chip mounting. It is suitable for a case where there is a delay until the subsequent chip mounting process is performed. Also, in a case where the subsequent chip mounting process does not use a reflow process, the formation of the solder joints 119 is can be completed before the chip mounting. However, in a case where the subsequent chip mounting process uses a reflow process, heating the solder paste at this stage can be omitted, and the completion of the solder joints 119 can be delayed until the reflow process of the subsequent chip mounting process.

The interconnection substrate 100 is obtained by the fabrication process shown in the series of FIGS. 3A-3C and FIGS. 4A-4C (including the organic base substrate 110, the interconnection layer 130, and the set of the solder joints 119 formed on the side connection pads 140 of the interconnection layer 130 and the corresponding conductive pads 114 of the organic base substrate 110) can be passed to a subsequent process such as chip mounting process.

Figure 5:
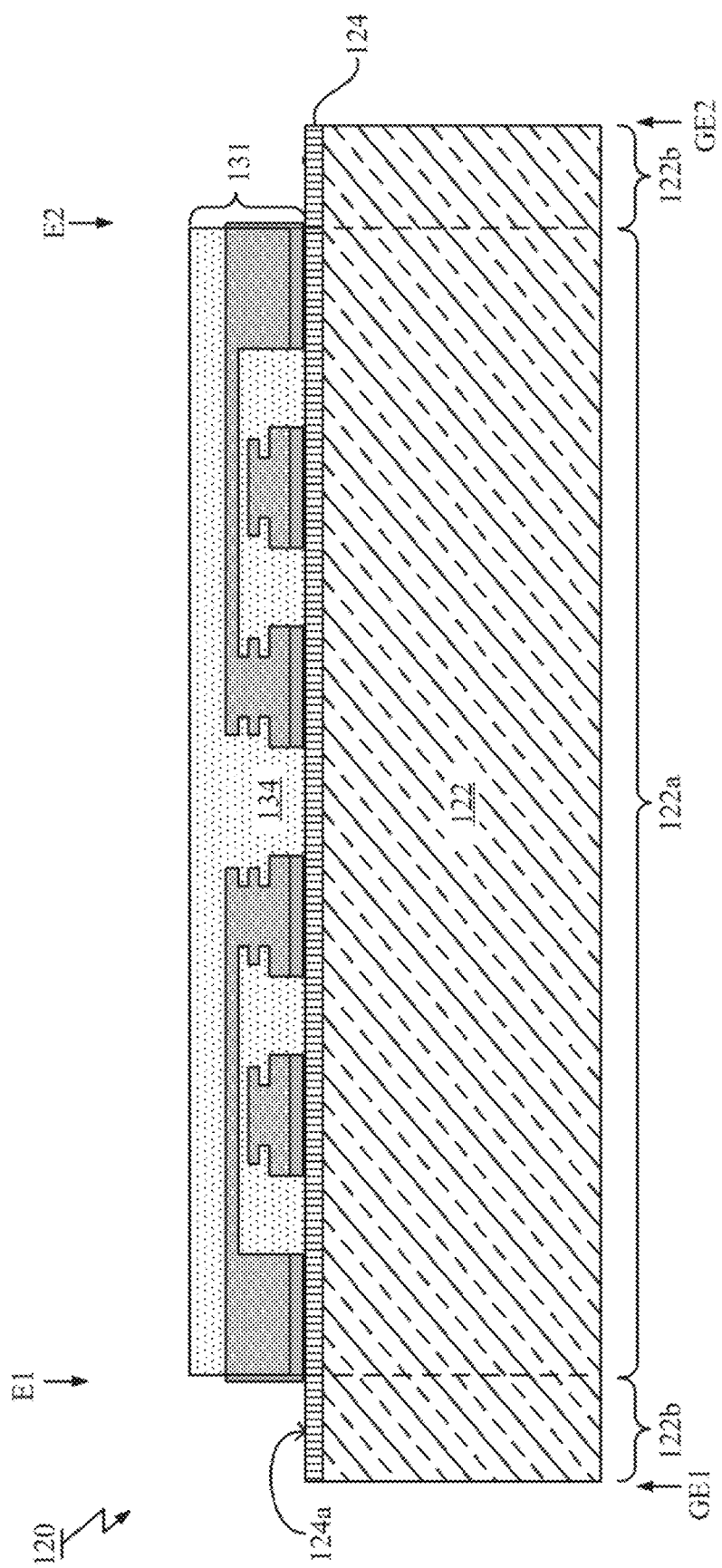
FIG. 5 illustrates a schematic of an interconnection layer carrying structure used for transferring an interconnection layer onto a target substrate according to other embodiment of the present disclosure.

FIG. 5 illustrates a schematic of an interconnection layer carrying structure used for transferring an interconnection layer onto a target substrate according to other embodiment of the present disclosure. In the embodiment described by referring to FIG. 2, the edges E1, E2 of the interconnection layer part 131 are aligned with the edges GE1, GE2 of the support substrate 122. In contrast, in the particular embodiment shown in FIG. 5, the interconnection layer part 131 is formed within a predefined area on the support substrate 122 such that the support substrate 122 has a base part 122*a* on which the interconnection layer part 131 is fabricated and extended parts (or eaves) 122*b* of both edges extending outside the base part 122*a*. The extended parts 122*b* are parts of the support substrate 122 that overhang edges E1, E2 of the interconnection layer part 131 when turned upside down. In the embodiment shown in FIG. 5, the edges E1, E2 of the interconnection layer part 131 are not aligned with the edges GE1, GE2 of the support substrate 122. The extended parts 122*b* of the support substrate 122 have planar surfaces configured to be approximately parallel to a planar surface of the organic base substrate 110 by way of abutment of the extended part 122*b* when transferring the interconnection layer 130 onto the organic base substrate 110 from the support substrate 122.

In embodiments, the organic base substrate 110 has the solder resist layer 116 that has the planar surface for the abutment. The planar surfaces of the extended parts 122*b* of the support substrate 122 are configured to abut against the planar surface of the solder resist layer 116 of the organic base substrate 110 directly or indirectly when transferring the interconnection layer 130.

In the particular embodiment, the planar surfaces of the extended parts 122*b* are provided as the top surface 124*a* of the release layer 124. However, it is not necessary that the release layer 124 extends to the areas of the extended parts 122*b* of the support substrate 122. In other embodiments, the extended parts 122*b* of the support substrate 122 provide directly planar surfaces that are configured to be approximately parallel to the planar surface of the solder resist layer 116 when the support substrate 122 is brought into contact with the solder resist layer 116.

Also, in the particular embodiment, the solder resist layer 116 has the planar surface for the abutment. However, in other embodiments, the level of the top surface of the interconnection layer 130 and the level of the top planar surface of the solder resist layer 116 can be adjusted by using an appropriate spacer that is inserted between the extended parts 122*a* of the support substrate 122 and the solder resist layer 116 so as to have a suitable level difference.

In the particular embodiment using the interconnection layer carrying structure 120 shown in FIG. 5, placing the interconnection layer carrying structure 120 onto the organic base substrate 110 shown in FIG. 3B includes a sub-step of leveling the planar surfaces of the extended parts 122*b* by way of abutment such that the planar surfaces of the extended parts 122*b* become approximately parallel to the top planar surface of the solder resist layer 116 of the organic base substrate 110.

Hereinafter, referring to FIGS. 6A-6D a process for fabricating an organic base substrate 110 according to embodiments of the present disclosure, is described. FIGS. 6A-6D illustrate cross-sectional views of structures obtained during the fabrication process of the organic base substrate 110.

Figure 6A:
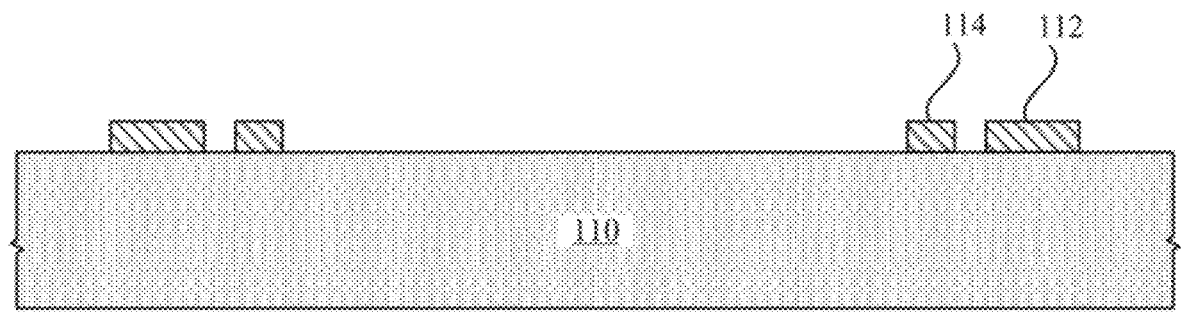
FIG. 6A illustrates a cross-sectional view of structures obtained during a fabrication process of an organic base substrate according to embodiments of the present disclosure.

As shown in FIG. 6A, the fabrication process can include preparing the organic base substrate 110 that includes the plurality of the bond pads 112 and the set of the conductive pads 114. The bond pads 112 and the conductive pads 114 can be made of metal copper and formed by any build-up process, including semi-additive, additive process, a subtractive process, etc. Although the process shown in FIGS. 6A-6D shows only the fabrication process of the conductive pad 112, 114. The organic base substrate is composed of a core of composite material such as a glass-epoxy, general wiring layers, and insulation layers.

Figure 6B:
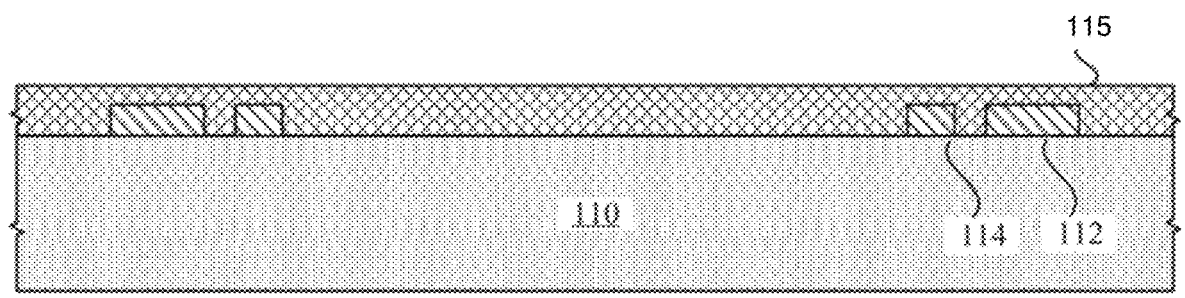
FIG. 6B illustrates a cross-sectional view of structures obtained during a fabrication process of an organic base substrate according to embodiments of the present disclosure.

As shown in FIG. 6B, the fabrication process can include applying photosensitive solder resist 115 on the organic base substrate 110, including areas of the bond pads 112 and the conductive pads 114. Such photosensitive resist is coated by any process, including, for example, spray coating, dip coating, curtain-coating, lamination, etc.

Figure 6C:
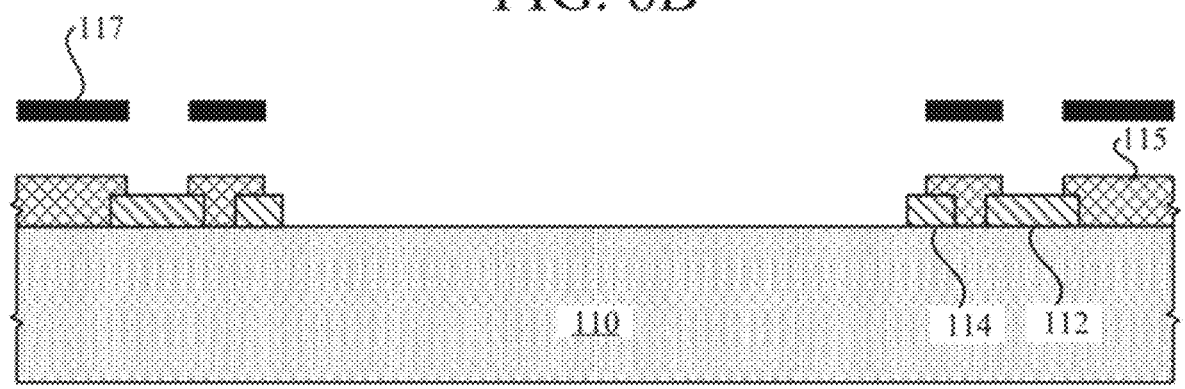
FIG. 6C illustrates a cross-sectional view of structures obtained during a fabrication process of an organic base substrate according to embodiments of the present disclosure.
Figure 6D:
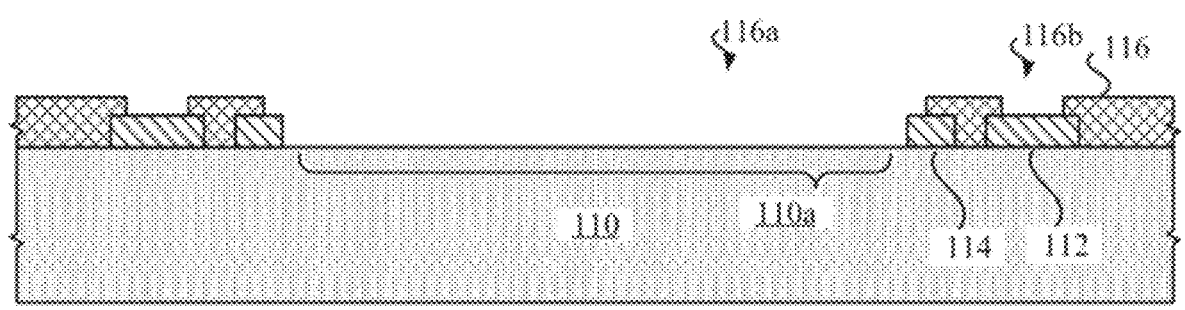
FIG. 6D illustrates a cross-sectional view of structures obtained during a fabrication process of an organic base substrate according to embodiments of the present disclosure.

As shown in FIG. 6C, the fabrication process can include exposing and developing the photosensitive solder resist 115 using a mask 117 to obtain the structure shown in FIG. 6D, which has a patterned solder resist 116. The patterned solder resist 116 shown in FIG. 6D has openings 116*b* on the bond pads 112 and a cavity 116*a* exposing the surface of the defined area 110*a* and the edges of the conductive pads 114 close to the defined area 110*a*. In the embodiment shown in FIG. 6C, the mask 117 is a dark field mask, and the solder resist is a positive type. However, in other embodiments, a light field mask and a negative type photo-sensitive resist material can also be employed.

Hereinafter, referring to FIGS. 7A-7D, an alternative process for fabricating an organic base substrate 110 according to other particular embodiment of the present disclosure, is described. FIGS. 7A-7D illustrate cross-sectional views of structures obtained during the alternative fabrication process of the organic base substrate.

Figure 7A:
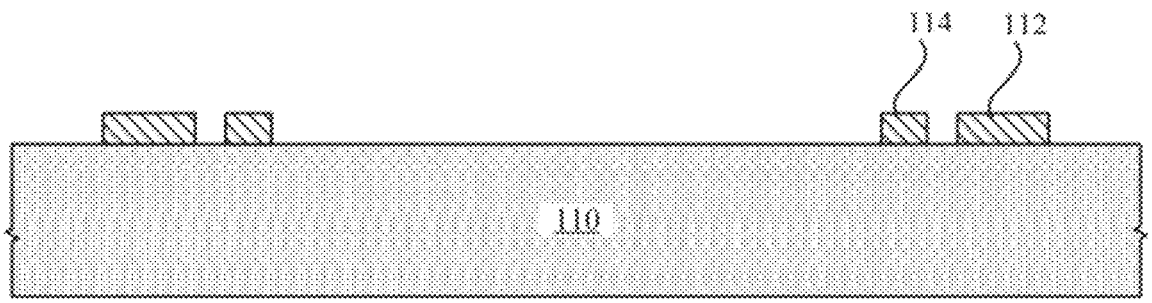
FIG. 7A illustrates cross-sectional view of structures obtained during a fabrication process of an organic base substrate according to other particular embodiment of the present disclosure.
Figure 7B:
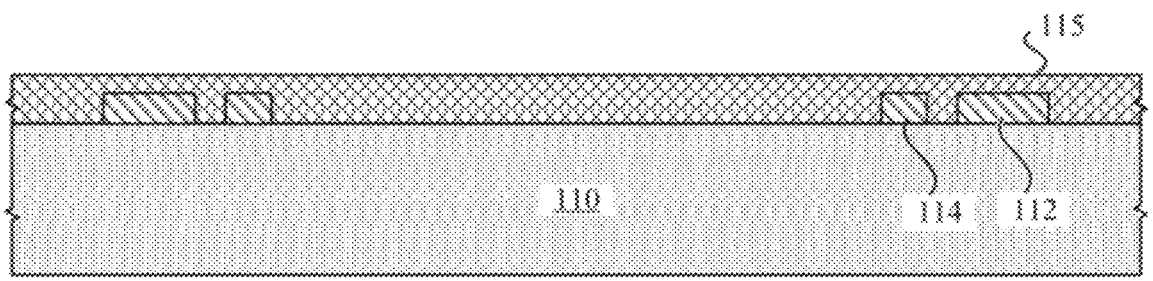
FIG. 7B illustrates a cross-sectional view of structures obtained during a fabrication process of an organic base substrate according to other particular embodiment of the present disclosure.
Figure 7C:
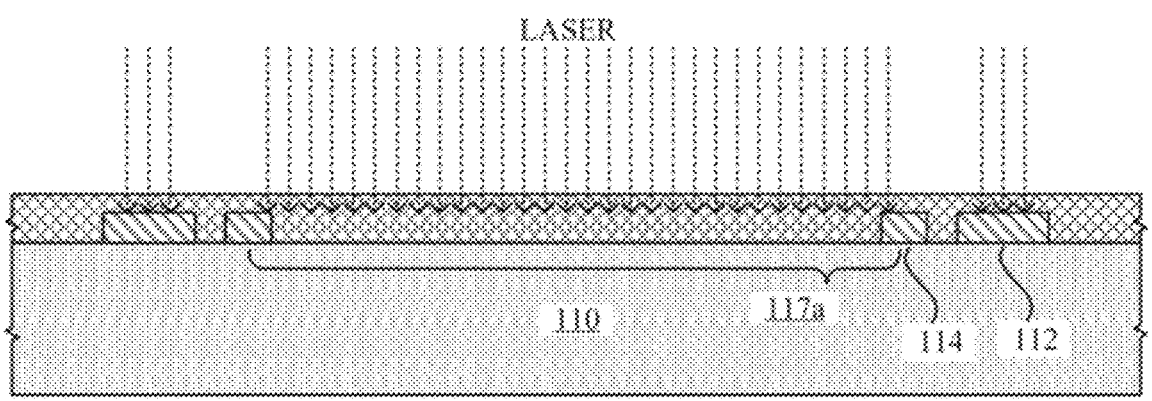
FIG. 7C illustrates a cross-sectional view of structures obtained during a fabrication process of an organic base substrate according to other particular embodiment of the present disclosure.
Figure 7D:
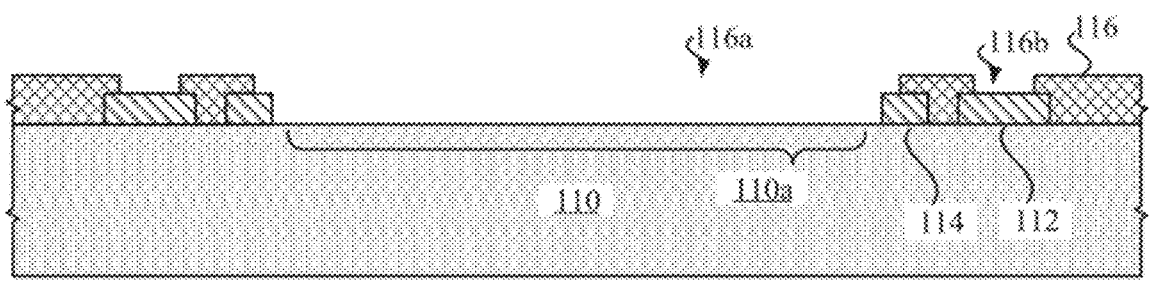
FIG. 7D illustrates a cross-sectional view of structures obtained during a fabrication process of an organic base substrate according to other particular embodiment of the present disclosure.

As shown in FIG. 7A, the fabrication process of the organic base substrate can include providing the organic base substrate 110 that includes the plurality of the bond pads 112 and the set of the conductive pads 114. As shown in FIG. 7B, the fabrication process can include applying solder resist 115 on the organic base substrate 110. As shown in FIG. 7C, the fabrication process can include processing the solder resist 115 by laser irradiation to obtain the structure shown in FIG. 7D, which has a patterned solder resist 116. The patterned solder resist 116 has openings 116*b* on the bond pads 112 and a cavity 116*a* exposing the defined area 110*a* and the edges of the conductive pads 114 close to the defined area 110*a*.

Hereinafter, referring to FIG. 8, a schematic of an interconnection structure after chip mounting according to the exemplary embodiment of the present disclosure is described.

Figure 8:
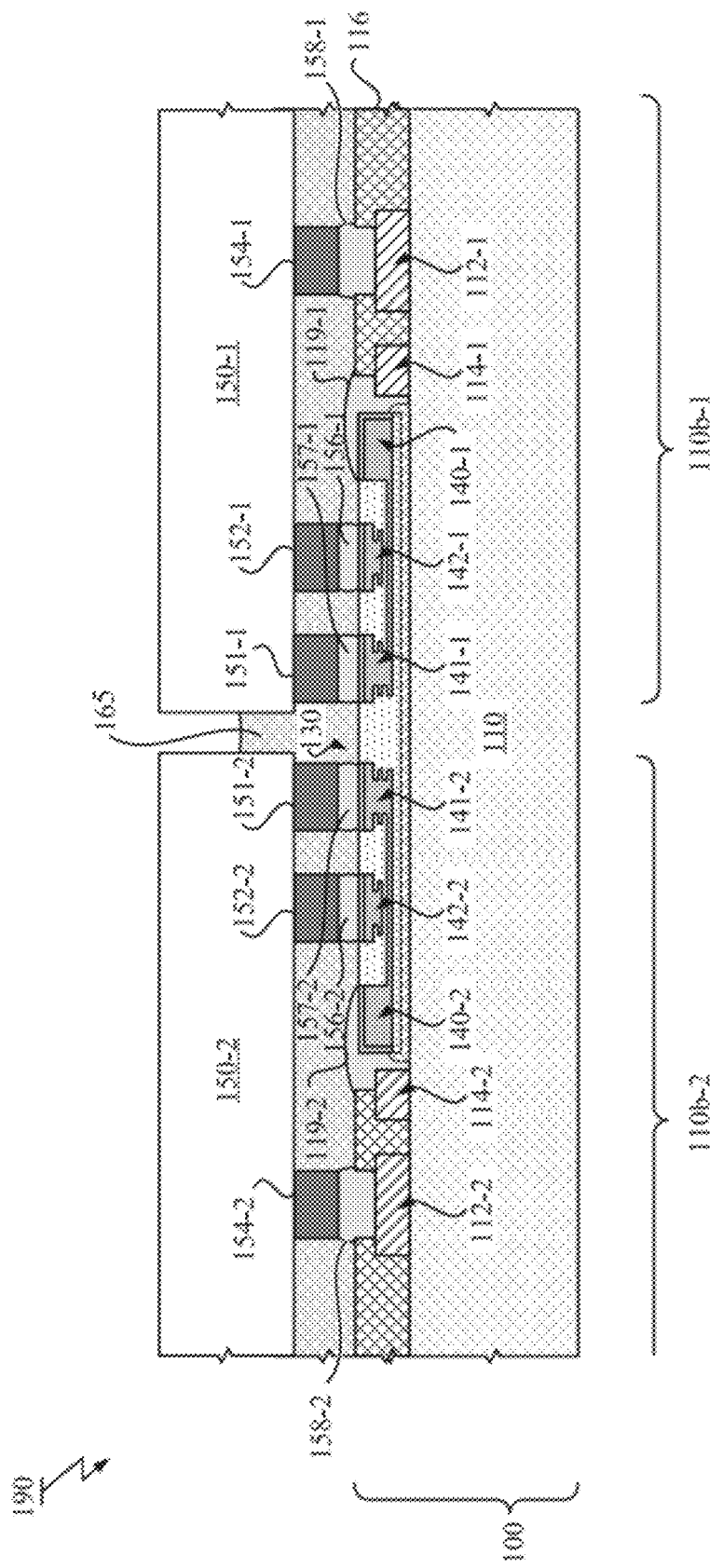
FIG. 8 illustrates a cross-sectional view of an electronic device around the interconnection layer according to an exemplary embodiment of the present disclosure.

FIG. 8 illustrates a schematic of an electronic device 190 that includes an interconnection substrate 100 as an interposer and is an interconnection structure after the chip mounting. FIG. 8 shows an enlarged cross-sectional view of the electronic device 190 around the interconnection layer 130. As shown in FIG. 8, there are two chips 150-1 and 150-2 mounted on the interconnection substrate 100. Examples of the chip can include a CPU (Central Processing Unit), a GPU (Graphical Processing Unit), an SoC (System on a Chip), a memory device such as an HBM (High Bandwidth Memory), etc. The first chip 150-1 and the adjacent second chip 150-2 can be configured to perform signal transmission each other through the interconnection layer 130 that is located between the first and second chips 150-1, 150-2. In the described embodiment, the chips 150 are connected to a power supply or ground line of the organic base substrate 110, which works as a signal return current path through the wiring in the interconnection layer 130.

As shown in FIG. 8, the electronic device 190 includes the aforementioned interconnection substrate 100; and the first and second chips 150-1, 150-2 mounted on the interconnection substrate 100 with its active surface being faced down. Each chip 150 can be located at a position corresponding to the flip-chip area 110b on the interconnection substrate 100. The gap between the interconnection substrate 100 and the chip 150 can be filled by an underfill 165, which can be made of epoxies or urethanes.

The first group of the bond pads 112-1 and the first set of the bond pads 141-1, 142-1 are positioned within the first flip-chip area 110b-1, where the first chip 150-1 is mounted. The first chip 150-1 has a set of terminal bumps 151-1, 152-1 electrically connected to the first set of the pads 141-1, 142-1 of the interconnection layer 130 through a solder 156-1, 157-1. The first chip 150-1 also has a set of other terminals 154-1 electrically connected to the first group of the bond pads 112-1 on the organic base substrate 110 through a solder 158-1. The terminal bumps 151-1, 152-1, 154-1 can be, but are not limited to, Cu pillar type bumps. The terminal bumps 151-1 can be a power supply or ground terminal that is configured to connect with the power supply or ground line that can work as a signal return current path. More specifically, the terminal bumps 151 can be connected to the bond pad 141 that is connected, via wiring embedded in the organic insulation material 134, to the corresponding side connection pad 140 that is further connected to the power supply line or the ground line of the organic base substrate 110 through the solder joint 119. The same applies to the second flip-chip area 110b-2 and the second chip 150-2.

Although not shown in FIG. 8, the interconnection substrate 100 on which the plurality of the chips 150 are mounted constitutes an electronic package, which can have bumps formed at the bottom of the interconnection substrate 100 and is further mounted on a mother board through package interconnections between the bumps of the interconnection substrate 100 and pads formed on the mother board. The final assembly product, including the interconnection substrate 100, the chips 150, and the mother board, can also be one of the electronic devices and is also an interconnection structure after the chip mounting.

The plurality of chips 150 can communicate with each other through the interconnection layer 130, while the chips 150 can be connected to the mother board through the internal structure of the organic base substrate 110. Further, according to the described embodiment, the power supply lines and the ground lines to the chips 150 can be routed through the interconnection layer 130 by way of the side connections achieved by the solder joint 119. It permits the suppression of voltage drops in comparison with instances where routing of the wiring on the organic base substrate is completed while avoiding an area of the interconnection layer. Provision of a power supply or ground line that works as a signal return current path by using the interconnection layer can be advantageous for high-speed signal transmission.

The interconnection structure facilitates a novel side connection between the conductive pad 114 of the organic base substrate 110 and the side connection pad 140 of the interconnection layer 130. Introduction of the novel side connection improves flexibility for routing of wiring with the interconnection layer 130. Also, it relaxes constraints on a terminal layout of the chip 150 that uses the interconnection layer 130. Such interconnection structure is suitable for heterogeneous integration.

FIG. 8 depicts two chips and one interconnection layer 130 through which the two chips communicate. However, the number of chips, the number of chips per interconnection layer, and the number of the interconnection layers in the electronic device are not limited.

Figure 9A:
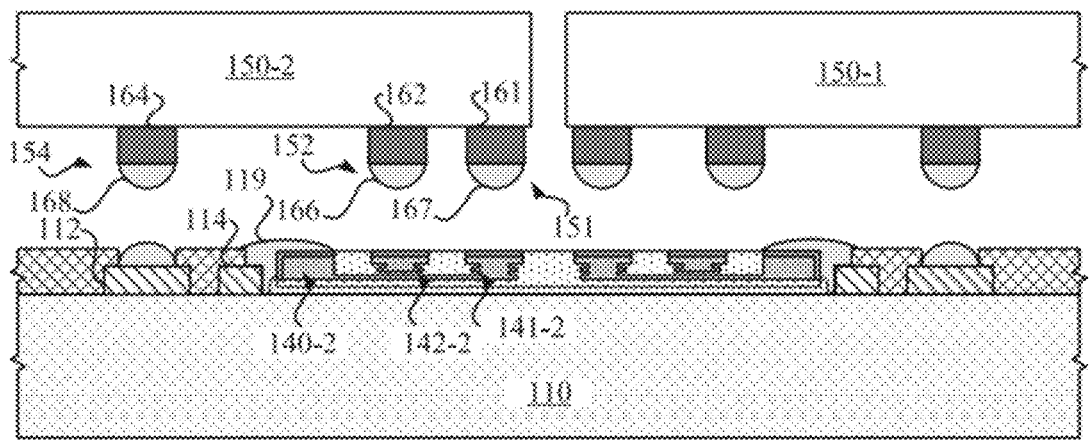
FIG. 9A illustrates a cross-sectional view of structures obtained during a fabrication process of an electronic device according to the exemplary embodiment of the present disclosure.
Figure 9B:
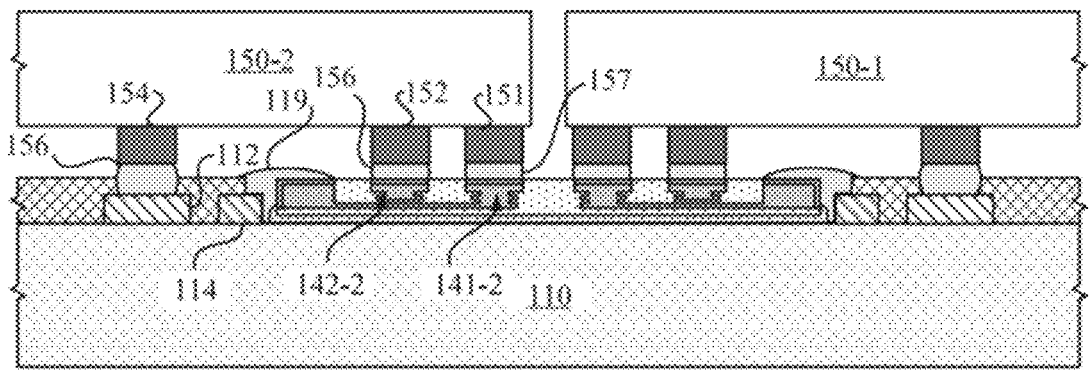
FIG. 9B illustrates a cross-sectional view of structures obtained during a fabrication process of an electronic device according to the exemplary embodiment of the present disclosure.
Figure 9C:
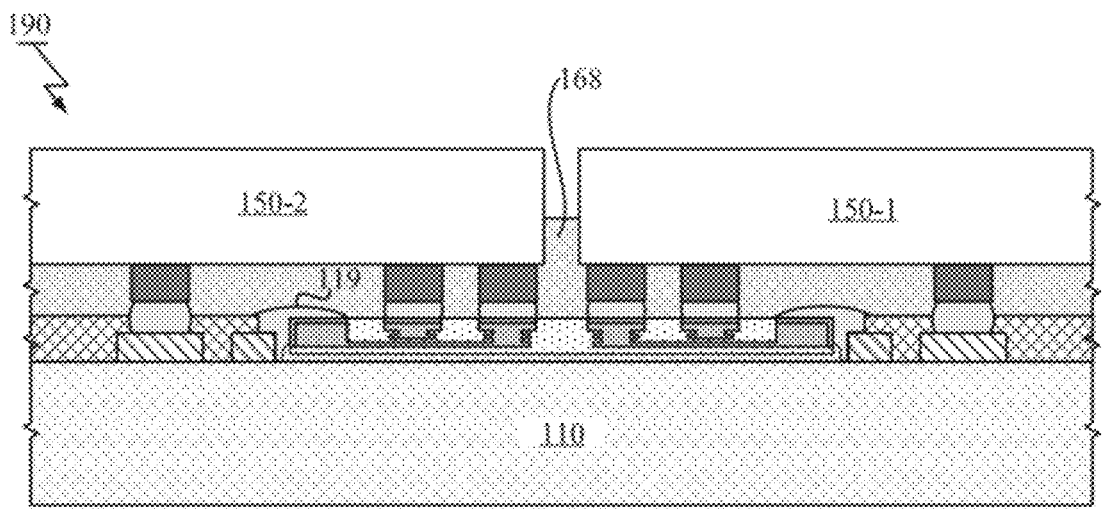
FIG. 9C illustrates a cross-sectional view of structures obtained during a fabrication process of an electronic device according to the exemplary embodiment of the present disclosure.

Referring to FIGS. 9A-9C, a fabrication process of the electronic device that is subsequently performed after the fabrication process of the interconnection substrate is illustrated according to the exemplary embodiment of the present disclosure. FIGS. 9A-9C illustrate cross-sectional views of structures obtained during the fabrication process of the electronic device 190.

As shown in FIG. 9A, the fabrication process of the electronic device can include mounting a plurality of chips 150 onto the interconnection substrate 100 with its active surface being faced down. The first chip 150-1 can be located at a position where the first group of the bond pads 112-1 and the first set of the pads 141-1, 141-2 of the interconnection layer 130 are located. The same applies to the second chip 150-2.

The chips 150 prepared for this step can include terminal bumps 151, 152, 154, each of which can be made up of a pillar 161, 162, or 164 and a solder cap 166, 167, or 168 formed thereon. In the described embodiment, the terminal bumps 151, 152, 154 are Cu pillar bumps. However, in other embodiments, the terminal bumps 151, 152, 154 can be any of, for example, flip-chip bump, fine-pitch, micro-bump, Cu pillar bump, Cu post bump with Sn a cap (SLID), etc. In the described embodiment, there is no solder on the bond pads 141, 142 of the interconnection substrate 100 prepared for this step since each bond pad 141, 142 has the barrier metal layer 138 on top, which improves wettability. However, applying solder onto the bond pads 141, 142 before chip mounting can be completed.

As shown in FIG. 9B, the fabrication process can include forming solder interconnection 156, 157, 158 between the bond pads 112 and the bond pads 141, 142 and the pillars 161, 162, 164 by a solder reflow process.

By performing the steps shown in FIGS. 9A and 9B, the chips 150 are mounted on the interconnection substrate 100 such that the chips 150 has terminal bumps 151 that are bonded to the bond pads 141 and are electrically connected to the conductive pads 114 disposed on the organic base substrate 110 through the side connection pads 140 by the solder joints 119.

As shown in FIG. 9C, the fabrication process can include dispensing a underfill 168 to fill a gap between the interconnection substrate 100 and the chips 150 by capillary flow underfill process, followed by curing so as to fix the first chip 150-1 and the second chip 150-2 to the interconnection substrate 100.

In the described embodiment, the underfill 168 is described as being applied onto the organic base substrate 110 after it has been subjected to the reflow treatment. However, in other embodiments, no-flow underfill may be dispensed on the interconnection substrate 100 initially. The chips 150 may be placed on the interconnection substrate 100, where the underfill has been dispensed. Forming of the solder interconnections 156, 157, 158 and curing of the underfill can be performed by a reflow treatment simultaneously. In the described embodiment, the solder reflow process is used as a bonding process. However, in other embodiments, thermal compression (TC) bonding process can also be contemplated instead of the solder reflow process.

Hereinafter, referring to a series of FIGS. 10A-10F, FIGS. 11A-11E, FIGS. 12A-12D, FIGS. 13A-13E, FIGS. 14A-14D and FIGS. 15A-15E, a process for fabricating an interconnection layer carrying structure, which can be used to transfer an interconnection layer onto an organic base substrate is described, according to an exemplary embodiment of the present disclosure. FIGS. 10A-10F, FIGS. 11A-11E, FIGS. 12A-12D, FIGS. 13A-13E, FIGS. 14A-14D and FIGS. 15A-15E illustrate cross-sectional views of structures obtained during the fabrication process of the interconnection layer carrying structure 120.

Figure 10A:
FIG. 10A illustrates a cross-sectional view of structures obtained during a fabrication process of the interconnection layer carrying structure according to an exemplary embodiment of the present disclosure.

As shown in FIG. 10A, the fabrication process of the interconnection layer carrying structure 120 can include preparing a support substrate 200. In the described embodiment, the support substrate 200 prepared by this step is a glass wafer or panel, and the following process is described assuming a laser de-bonding process. However, in the case of a mechanical or a thermal de-bonding process, other substrates such as a silicon wafer can be used as the support substrate 200. The thickness of the support substrate 200 can range from several hundreds of micrometers to several millimeters, for example.

Figure 10B:
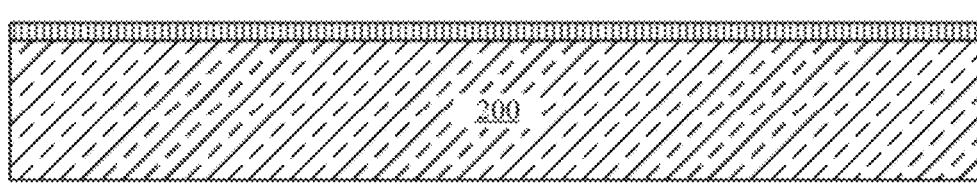
FIG. 10B illustrates a cross-sectional view of structures obtained during a fabrication process of the interconnection layer carrying structure according to an exemplary embodiment of the present disclosure.

As shown in FIG. 10B, the fabrication process can include applying a release layer 202 on the support substrate 200. The release layer 202 can be formed by any suitable means, including, for example, spin coating. In one embodiment, the thickness of the release layer 202 can be approximately or less than 1 micrometer, for example. An interconnection layer part is built on the release layer 202 through steps described below after the formation of the release layer 202 is complete.

Figure 10C:
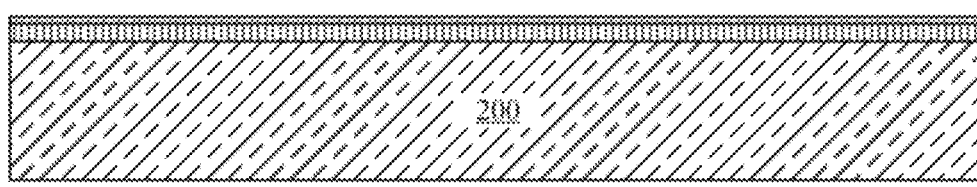
FIG. 10C illustrates a cross-sectional view of structures obtained during a fabrication process of the interconnection layer carrying structure according to an exemplary embodiment of the present disclosure.

As shown in FIG. 10C, the fabrication process can include forming a first seed metal layer 204 onto the release layer 202. The first seed metal layer 204 can be formed by any suitable means, including sputtering. In embodiments, a stack of a titanium layer and a copper layer (Ti/Cu where Ti is the bottom in the stack) is formed on the release layer 202 by sputtering to form the first seed metal layer 204. In one embodiment, the titanium layer can have several tens of nanometers thickness, and the copper layer can have several hundreds of nanometers thickness (e.g., the titanium layer between 25-100 nm thick and the copper layer between 100-500 nm thick). The same applies to other seed layers that will be described below.

Figure 10D:
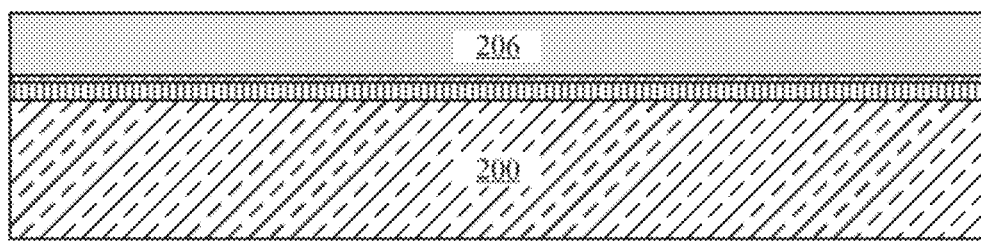
FIG. 10D illustrates a cross-sectional view of structures obtained during a fabrication process of the interconnection layer carrying structure according to an exemplary embodiment of the present disclosure.

As shown in FIG. 10D, the fabrication process can include depositing a plating resist 206 onto the first seed metal layer 204. In embodiments, the plating resist 206 can be made of any one of photosensitive resins. The thickness of the plating resist 206 can range from 10 micrometers to 50 micrometers. The plating resist 206 can be formed by any suitable means, including, for example, spin coating. The film type resist can also be used as well as the liquid type resist. In the case of the film type resist, the plating resist 206 can be made by a lamination process. The same applies to other plating resists that will be described below.

Figure 10E:
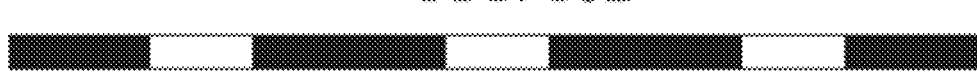
FIG. 10E illustrates a cross-sectional view of structures obtained during a fabrication process of the interconnection layer carrying structure according to an exemplary embodiment of the present disclosure.

As shown in FIG. 10E, the fabrication process can include making a plurality of openings 206a into the plating resist 206. The openings 206a correspond to the pads 140, 141, 142 shown in FIG. 2. The openings 206a can be fabricated by any suitable means, including, for example, photolithography. In embodiments, the photosensitive resin deposited by spin coating can be exposed through a photomask 208 and developed to make the openings 206a in the plating resist 206. Note that the fabrication process is described using a specific type of resist or photosensitive resin in terms of patterning. For example, FIG. 10E shows a case of using a positive type resist. However, the type of the resist or photosensitive resin is not limited to the specific type shown in the drawings. Positive and negative type resist or photosensitive resin can be employed as well. The same applies to other resists and photosensitive resins that will be described below.

Figure 10F:
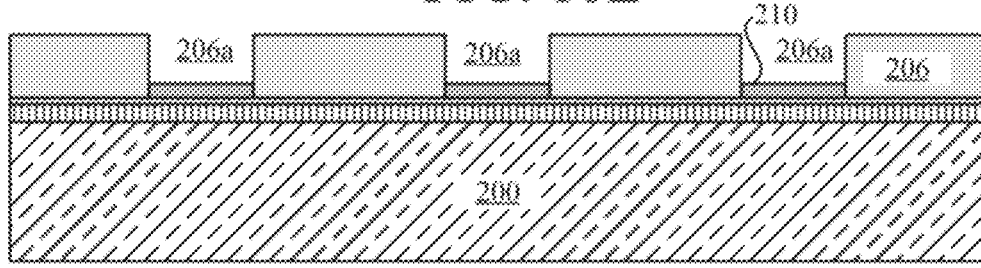
FIG. 10F illustrates a cross-sectional view of structures obtained during a fabrication process of the interconnection layer carrying structure according to an exemplary embodiment of the present disclosure.

As shown in FIG. 10F, the fabrication process can further include forming a barrier metal layer 210 onto the first seed metal layer 204 at positions of the openings 206a of the plating resist 206. In embodiments, the barrier metal layer 210 is an Au/Pd/Ni metal stack, which can include a gold layer on the first seed metal layer 204, a palladium layer on the gold layer, and a nickel layer on the palladium layer. The gold layer becomes top when the resultant interconnection layer 130 is transferred onto the organic base substrate 110 during the fabrication process of the interconnection substrate 100. The barrier metal layer 210 can be formed on the first seed metal layer 204 by any suitable metallization process, which can include, for example, electrolytic plating.

Figure 11A:
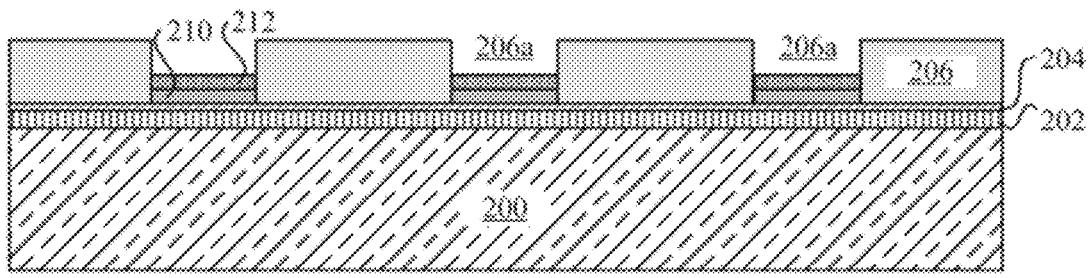
FIG. 11A illustrates a cross-sectional view of structures obtained during the fabrication process of the interconnection layer carrying structure according to the exemplary embodiment of the present disclosure.

As shown in FIG. 11A, the fabrication process can include depositing a first conductive layer 212 on the barrier metal layer 210. The first conductive layer 212 can be formed by any suitable means, including, for example, electroplating. In embodiments, a metal copper is deposited by electroplating to form the first conductive layer 212. The same applies to other conductive layers that will be described below.

Figure 11B:
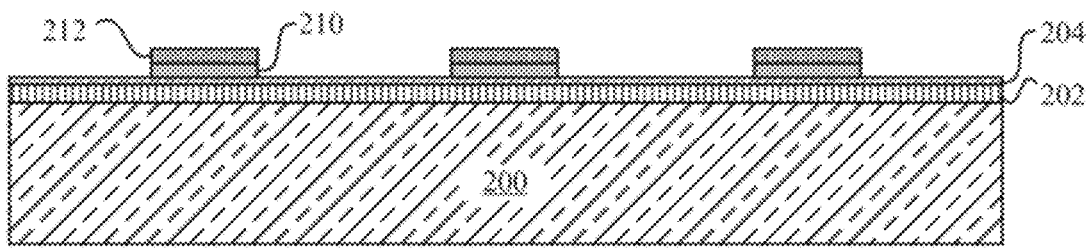
FIG. 11B illustrates a cross-sectional view of structures obtained during the fabrication process of the interconnection layer carrying structure according to the exemplary embodiment of the present disclosure.
Figure 11C:
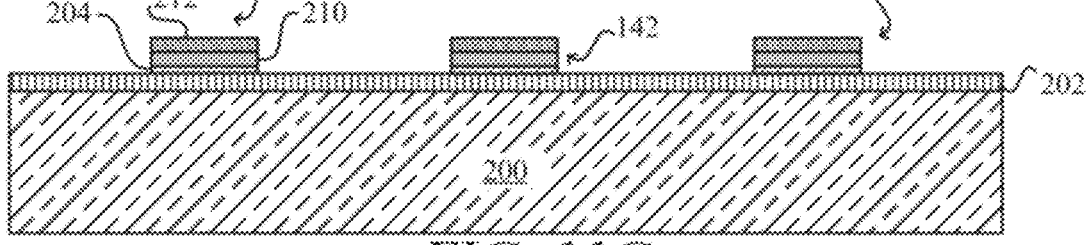
FIG. 11C illustrates a cross-sectional view of structures obtained during the fabrication process of the interconnection layer carrying structure according to the exemplary embodiment of the present disclosure.

As shown in FIG. 11B, the fabrication process can include removing the plating resist 206 from the first seed metal layer 204. As shown in FIG. 11C, the fabrication process can include removing portions of the first seed metal layer 204 that are exposed from the metal stacks 210, 212.

By performing the steps shown in FIGS. 10C-10F and FIGS. 11A-11C, conductive material is patterned to form a set of side connection pads 140 and bond pads 141, 142 formed on the release layer 202.

Figure 11D:
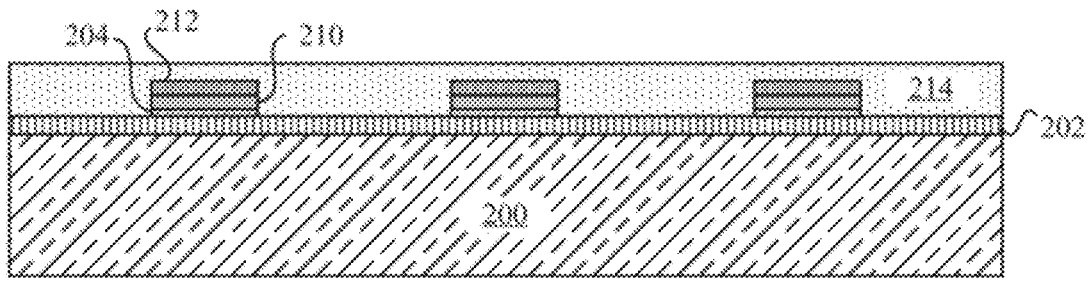
FIG. 11D illustrates a cross-sectional view of structures obtained during the fabrication process of the interconnection layer carrying structure according to the exemplary embodiment of the present disclosure.

As shown in FIG. 11D, the fabrication process can include forming a first organic insulation part 214 on the release layer 202 so as to embed the set of the pads 140, 141, 142 (including the first seed metal layer 204, the barrier metal layer 210, and the first conductive layer 212). In embodiments, the first organic insulation part 214 is made of any one of photosensitive insulating resins. The thickness of the first organic insulation part 214 can range from several micrometers to several tens of micrometers. The first organic insulation part 214 can be formed by any suitable means, including, for example, spin coating. The film type resin can also be used as well as the liquid type resin. In case of the film type resin, the first organic insulation part 214 is made by lamination process. The same applies to other organic insulation parts that will be described below.

Figure 11E:
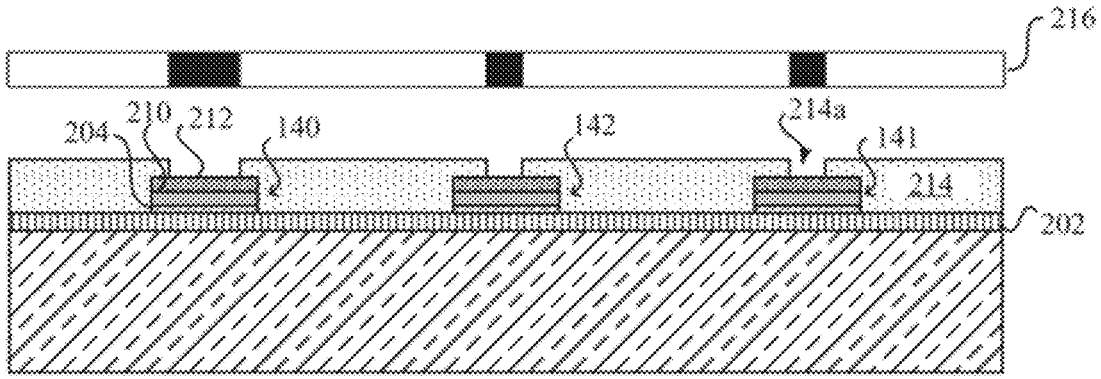
FIG. 11E illustrates a cross-sectional view of structures obtained during the fabrication process of the interconnection layer carrying structure according to the exemplary embodiment of the present disclosure.

As shown in FIG. 11E, the fabrication process can include exposing and developing the first organic insulation part 214 so as to have a plurality of via openings 214a at the positions of the pads 140, 141, 142. The via openings 214a can be fabricated by any suitable means, including, for example, photolithography. In embodiments, the photosensitive insulating resin deposited by spin coating is exposed through a photomask 216 and developed to make the via opening 214a. FIG. 11E shows a case of using the negative type resist.

Figure 12A:
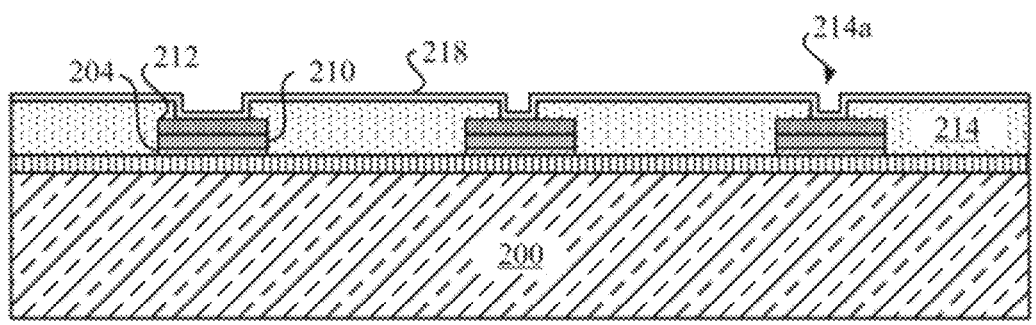
FIG. 12A illustrates a cross-sectional view of structures obtained during the fabrication process of the interconnection layer carrying structure according to the exemplary embodiment of the present disclosure.

As shown in FIG. 12A, the fabrication process can include forming a second seed metal layer 218 onto the top surface of the first organic insulation part 214 and exposed surfaces of the first conductive layer 212 in the via openings 214a.

Figure 12B:
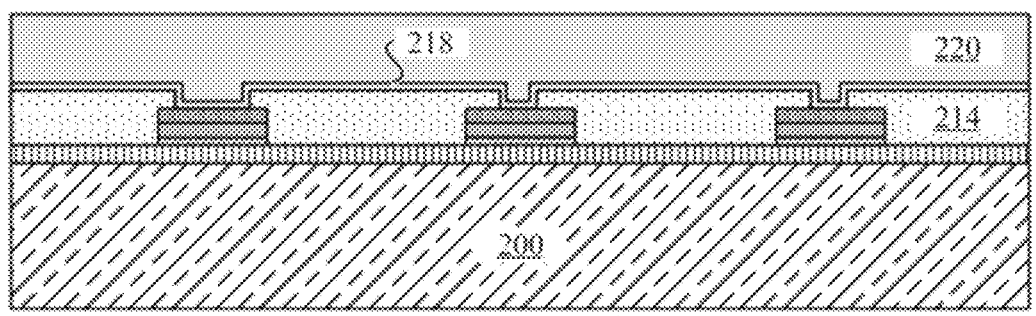
FIG. 12B illustrates a cross-sectional view of structures obtained during the fabrication process of the interconnection layer carrying structure according to the exemplary embodiment of the present disclosure.
Figure 12C:
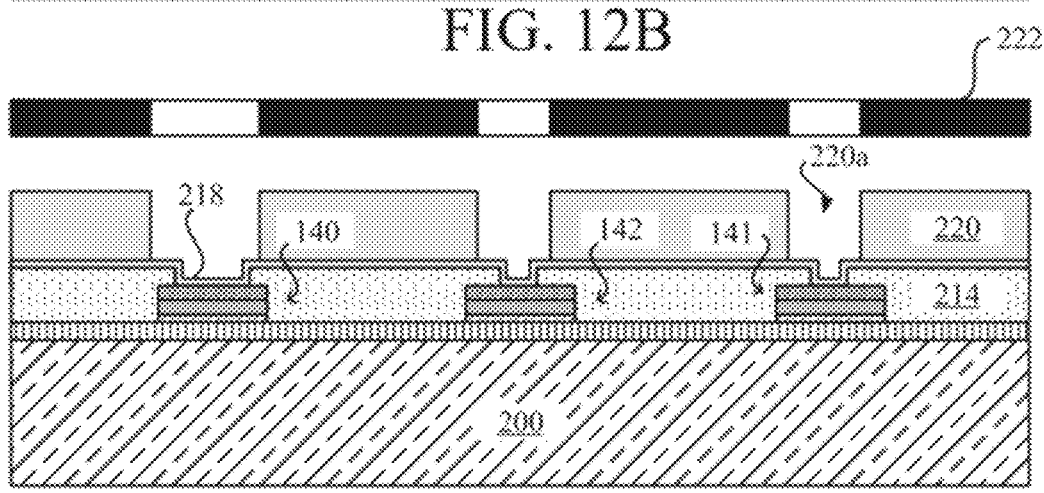
FIG. 12C illustrates a cross-sectional view of structures obtained during the fabrication process of the interconnection layer carrying structure according to the exemplary embodiment of the present disclosure.

As shown in FIG. 12B, the fabrication process can include depositing a plating resist 220 onto the second seed metal layer 218. As shown in FIG. 12C, the fabrication process can include patterning an opening pattern 220a in the plating resist 220 using a photomask 222. The opening pattern 220a includes a wiring or trace pattern for the bond pad 142. The opening pattern 214a can be fabricated by any suitable means, including, for example, photolithography. FIG. 12C shows a case of using a positive-type resist.

Figure 12D:
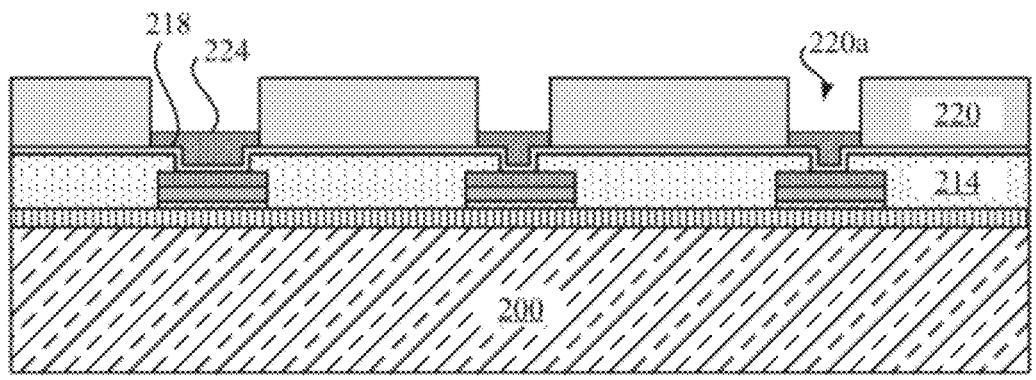
FIG. 12D illustrates a cross-sectional view of structures obtained during the fabrication process of the interconnection layer carrying structure according to the exemplary embodiment of the present disclosure.
Figure 13A:
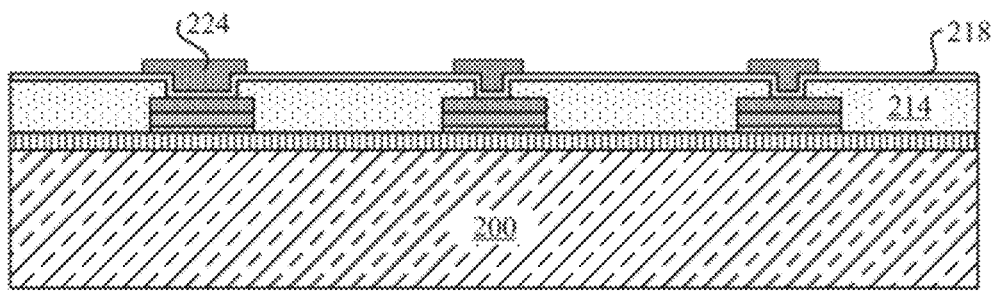
FIG. 13A illustrates a cross-sectional view of structures obtained during the fabrication process of the interconnection layer carrying structure according to the exemplary embodiment of the present disclosure.
Figure 13B:
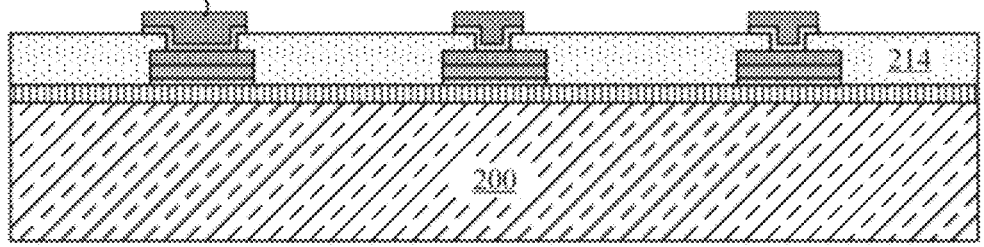
FIG. 13B illustrates a cross-sectional view of structures obtained during the fabrication process of the interconnection layer carrying structure according to the exemplary embodiment of the present disclosure.

As shown in FIG. 12D, the fabrication process can include depositing a second conductive layer 224 on regions of the second seed metal layer 218 where there is no plating resist. As shown in FIG. 13A, the fabrication process can include removing the plating resist 220 from the second seed metal layer 218. As shown in FIG. 13B, the fabrication process can include removing portions of the second seed metal layer 218 that are exposed from the second conductive layer 224.

By performing the steps shown in FIG. 11E, FIGS. 12A-12D and FIGS. 13A-13B, the conductive material is patterned to form a trace for connecting the bond pad 142 and a corresponding bond pad.

Figure 13C:
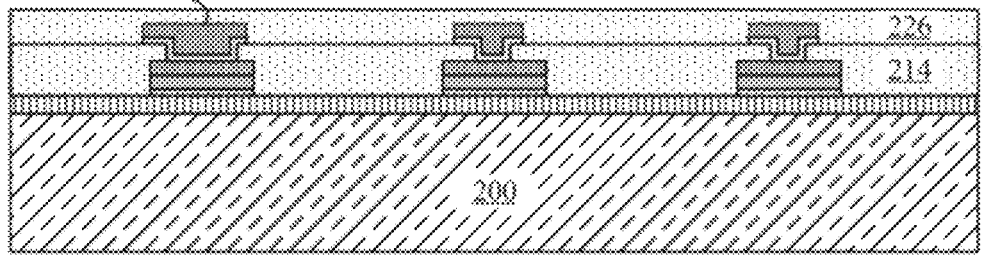
FIG. 13C illustrates a cross-sectional view of structures obtained during the fabrication process of the interconnection layer carrying structure according to the exemplary embodiment of the present disclosure.
Figure 13D:
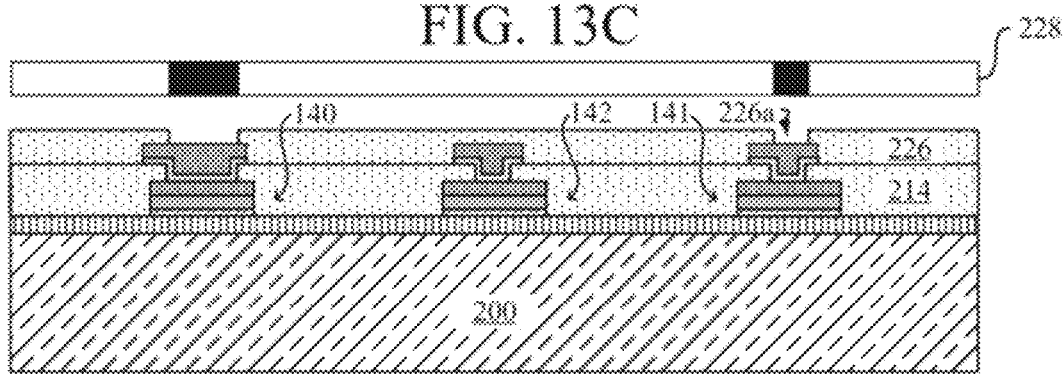
FIG. 13D illustrates a cross-sectional view of structures obtained during the fabrication process of the interconnection layer carrying structure according to the exemplary embodiment of the present disclosure.

As shown in FIG. 13C, the fabrication process can include depositing a second organic insulation layer 226 on the first organic insulation part 214 so as to embed the second conductive layer 224. As shown in FIG. 13D, the fabrication process can include exposing and developing the second organic insulation layer 226 so as to have a plurality of via openings 226a at the positions of the pads 140, 141. Since the bond pad 142 is isolated from the pads 140, 141, no opening is formed at the positions of the pads 142. FIG. 13D shows a case of using the negative type resist.

Figure 13E:
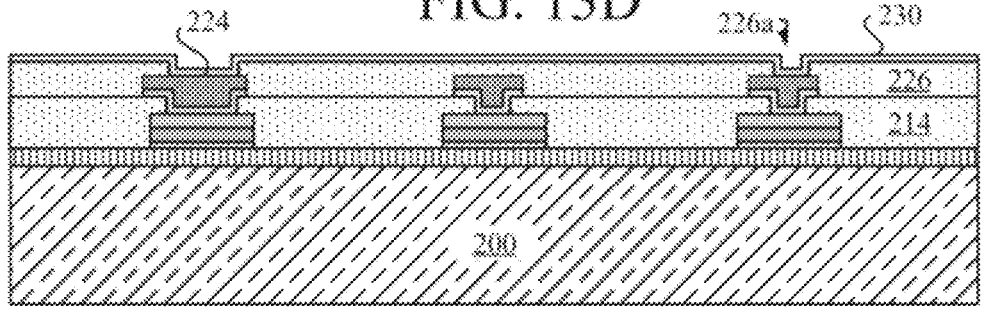
FIG. 13E illustrates a cross-sectional view of structures obtained during the fabrication process of the interconnection layer carrying structure according to the exemplary embodiment of the present disclosure.

As shown in FIG. 13E, the fabrication process can include forming a third seed metal layer 230 onto the top surface of the second organic insulation layer 226 and exposed surfaces of the second conductive layer 224 in the via openings 226a.

Figure 14A:
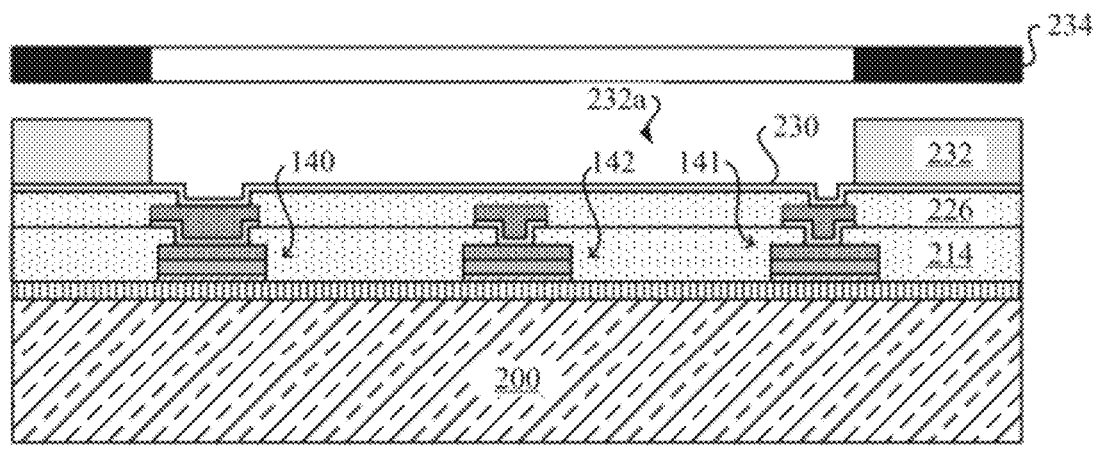
FIG. 14A illustrates a cross-sectional view of structures obtained during the fabrication process of the interconnection layer carrying structure according to the exemplary embodiment of the present disclosure.

As shown in FIG. 14A, the fabrication process can include patterning a plating resist 232 on the third seed metal layer 230 by using a photomask 234. The plating resist 232 has an opening pattern 232a that includes a wiring or trace pattern for the pad 140, 141. FIG. 14A shows a case of using the positive type resist.

Figure 14B:
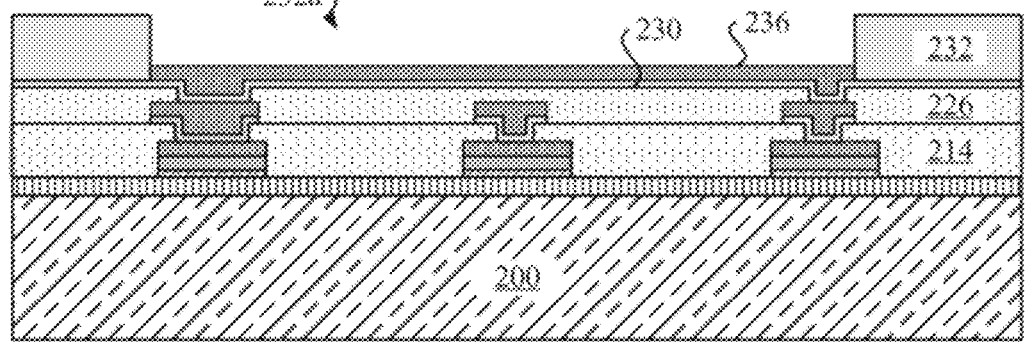
FIG. 14B illustrates a cross-sectional view of structures obtained during the fabrication process of the interconnection layer carrying structure according to the exemplary embodiment of the present disclosure.
Figure 14C:
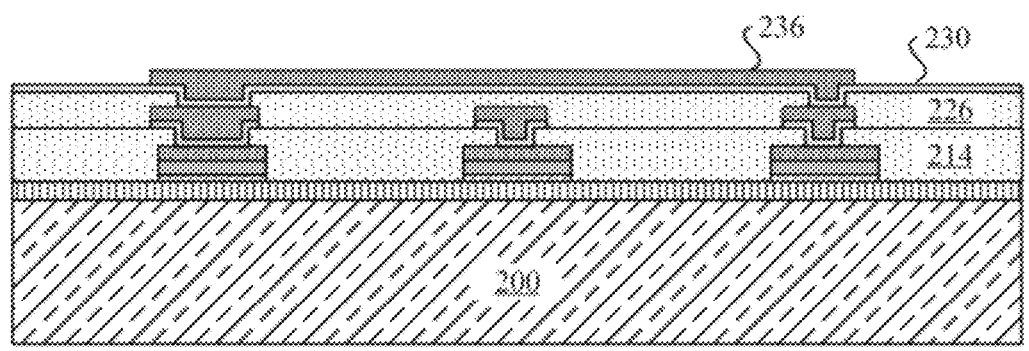
FIG. 14C illustrates a cross-sectional view of structures obtained during the fabrication process of the interconnection layer carrying structure according to the exemplary embodiment of the present disclosure.
Figure 14D:
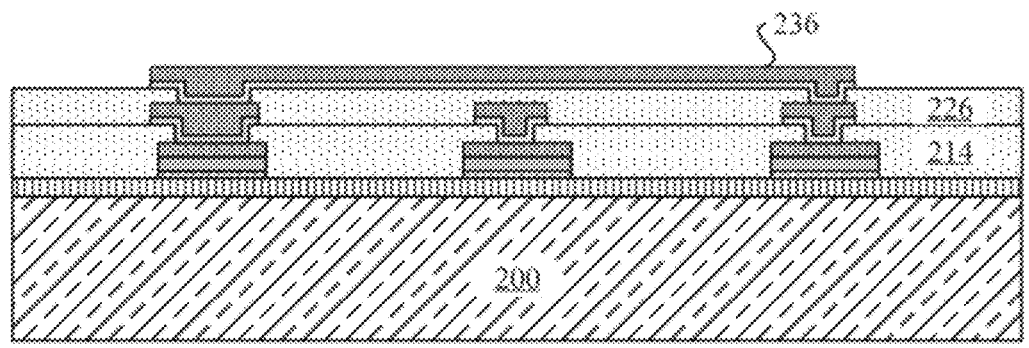
FIG. 14D illustrates a cross-sectional view of structures obtained during the fabrication process of the interconnection layer carrying structure according to the exemplary embodiment of the present disclosure.

As shown in FIG. 14B, the fabrication process can include depositing a third conductive layer 236 on regions of the third seed metal layer 230 where there is no plating resist. As shown in FIG. 14C, the fabrication process can include removing the plating resist 232 from the third seed metal layer 230. As shown in FIG. 14D, the fabrication process can include removing portions of the third seed metal layer 230 that are exposed from the third conductive layer 236.

By performing the steps shown in FIGS. 13C-13E and FIGS. 14A-14D, conductive material is patterned to form wiring for connecting the side connection pad 140 and a corresponding bond pad 141.

Figure 15A:
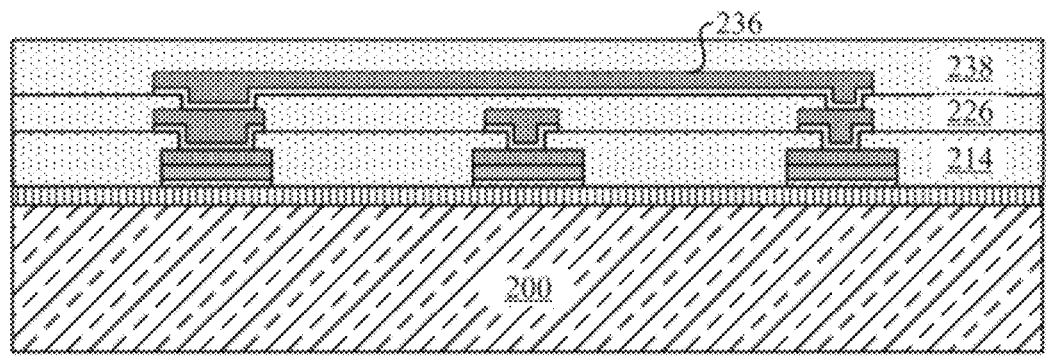
FIG. 15A illustrates a cross-sectional view of structures obtained during the fabrication process of the interconnection layer carrying structure according to the exemplary embodiment of the present disclosure.
Figure 15B:
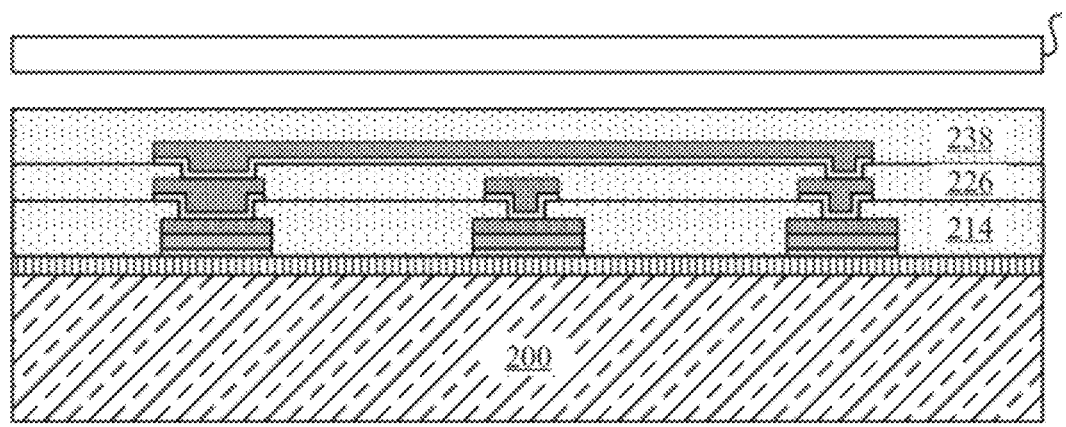
FIG. 15B illustrates a cross-sectional view of structures obtained during the fabrication process of the interconnection layer carrying structure according to the exemplary embodiment of the present disclosure.

As shown in FIG. 15A, the fabrication process can include depositing a third organic insulation layer 238 on the second organic insulation layer 226 to embed the third conductive layer 236. As shown in FIG. 15B, the fabrication process can include exposing and developing the third organic insulation layer 238 by using a photomask 240.

Figure 15C:
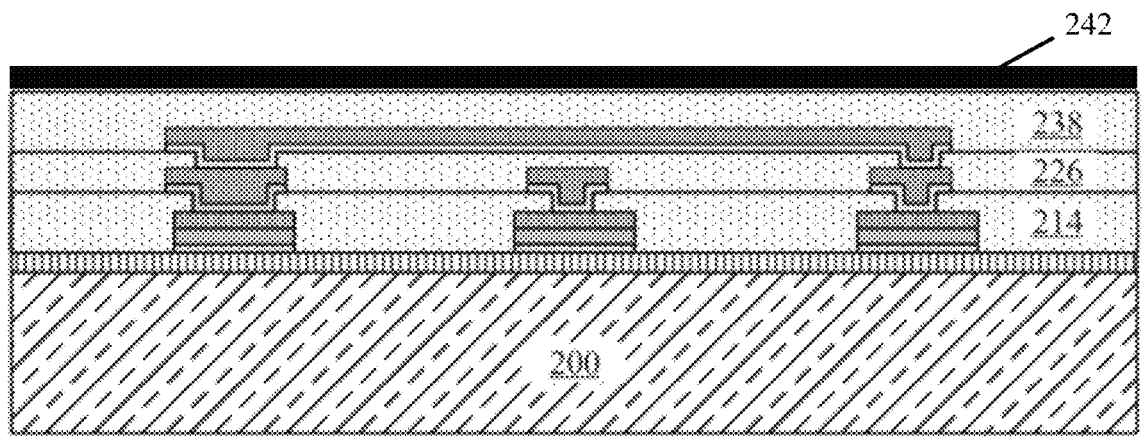
FIG. 15C illustrates a cross-sectional view of structures obtained during the fabrication process of the interconnection layer carrying structure according to the exemplary embodiment of the present disclosure.

As shown in FIG. 15C, the fabrication process can further include depositing a sacrificial layer 242 on top of the third organic insulation layer 238. This can reduce vertical stress exerted on the third organic insulation layer 238 during a dicing process (described at FIG. 15D), which may damage or remove the third organic insulation layer 238. For example, dicing the substrate 200 together with its superstructure using a dice blade can tear off the organic insulation layer 238, thereby exposing the third conductive layer 236, which may impair functionality of the interconnection layer carrying structure 120. The sacrificial layer 242 can be formed using any method and/or suitable material. In embodiments, the sacrificial layer 242 can be formed using a sputtering process, where metal(s) are deposited to form the sacrificial layer 242. For example, the sacrificial layer 242 can be a metal multi-layer (e.g., 50 nm thick Ti and 300 nm thick Cu, with Cu on the top layer and Ti underneath the Cu layer, as Ti can be used as an adhesive to the third organic insulation layer 238). This can enhance mechanical performance of the superstructure such that the dicing process does not remove the third organic insulation layer 238. In some embodiments, the sacrificial layer can be formed using non-metals, such as $SiO_2$ or SiN. In these embodiments, the sacrificial layer 242 can be deposited using chemical vapor deposition (CVD). However, it should be noted, that any type of material can be used to form sacrificial layer 242, any suitable process can be used to form sacrificial layer 242, any combination of materials can be used to form sacrificial layer 242, and the sacrificial layer can be any suitable thickness (e.g., 10 nm-1 μm).

Figure 15D:
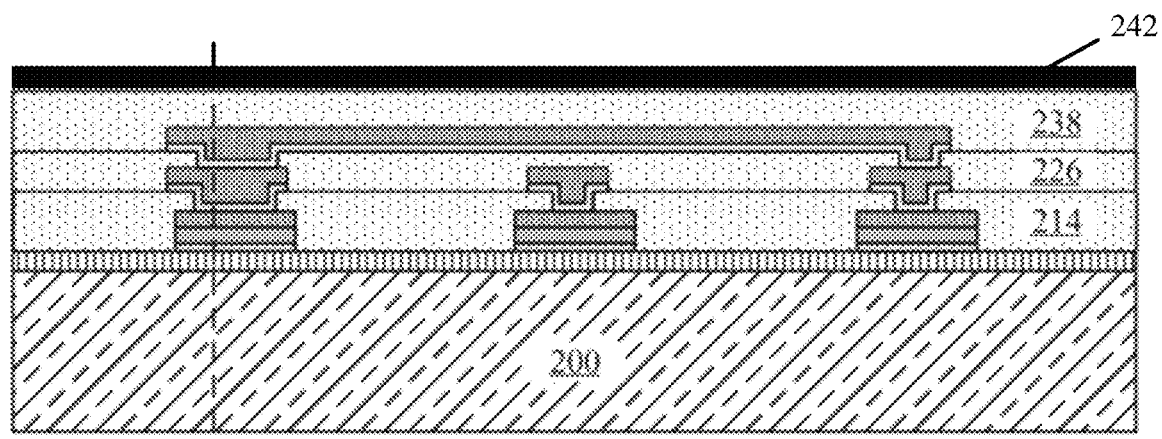
FIG. 15D illustrates a cross-sectional view of structures obtained during the fabrication process of the interconnection layer carrying structure according to the exemplary embodiment of the present disclosure.

As shown in FIG. 15D, the fabrication process can further include cutting the support substrate 200 together with its superstructure (including the release layer 202) and the sacrificial layer 242 using a dicing blade. For example, dicing can be completed using a blade (e.g., XD1000-25GM410) under 30,000 RPM to at a rate of 1 mm/sec. Upon cutting the support substrate 200 together with its superstructure and the sacrificial layer 242, the sacrificial layer 242 can be removed using any suitable process to obtain an individual structure shown in FIG. 15E, similar to the interconnection layer carrying structure 120 shown in FIG. 2. For example, removing the sacrificial layer 242 can include wet etching if the sacrificial layer is comprised of Ti and Cu. As another example, dry etching can be used to remove the sacrificial layer if formed using materials such as Al, Ni, Si, $SiO_2$, and SiN. The cutting line (a dashed line in FIG. 15D) corresponds to one edge E of the interconnection layer carrying structure 120 and passes a position where the metal stack corresponding to the side connection pad 140 is split. Cutting the support substrate 200 and removing the sacrificial layer 242 completes the fabrication of the set of the side connection pads 140. Ultimately, by fabricating the interconnection layer carrying structure 120 using the sacrificial layer 242, preservation of the organic insulation layer 238 can be achieved thereby improving integrity of the interconnection layer carrying structure 120.

Since the outline of the interconnection layer part 131 is defined by a cutting process, the edge of the interconnection layer part 131 has a straight shape, and the set of side connection pads 140 is formed in a line, and accordingly, the set of conductive pads 114 as a counterpart is also formed in a line.

Note that the fabrication process can further include forming a barrier metal layer on the edge surface ES of the side connection pads 140, by any suitable metallization process, which can include, for example, electroless plating. In embodiments where the electroless plating is employed, exposed edge surfaces ES of the side connection pads 140 are plated selectively to form the barrier metal layer on the edge surface ES of the side connection pads 140. The formation of the barrier metal layer can be completed before attachment of the interconnection layer part 131 to the organic base substrate in order to avoid the occurrence of voids owing to pad size difference between the interconnection layer part 131 and the organic base substrate 110. Although there is a difference in compositions and additives of the barrier metal layer between the top surface TS and the edge surface ES, the barrier metal layer of the edge surface ES can be the same as that of the top surface TS in terms of the combination of metal materials to make diffusion rate of solder elements homogeneous, which could alleviate the local formation of alloy and stress concentration. For example, when the barrier metal for the top surface TS is a Ni/Au stack, a Ni/Au stack can be employed for the edge surface ES.

Figure 15E:
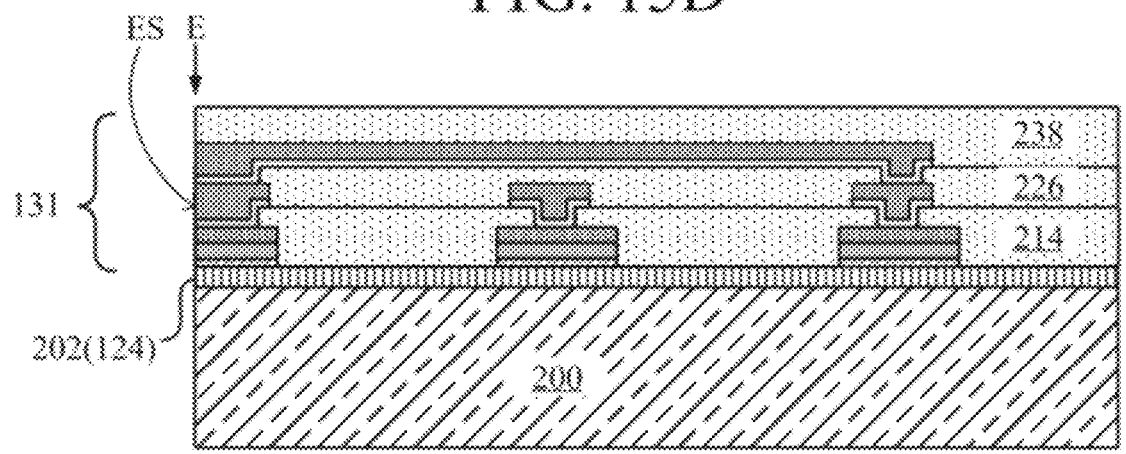
FIG. 15E illustrates a cross-sectional view of structures obtained during the fabrication process of the interconnection layer carrying structure according to the exemplary embodiment of the present disclosure.

The interconnection layer carrying structure 120 obtained by this process can be passed to a subsequent process such as interconnection substrate fabrication shown in the series of FIGS. 3A-3C and FIGS. 4A-4C. In one embodiment, the interconnection layer carrying structure 120 is segmented from the glass wafer or panel by dicing as shown in FIG. 15E can be provided to next in a production chain. The interconnection layer part 131 is provided as a form of tape that is formed by organic material and held by the support substrate 122 as a rigid backing material.

The interconnection layer carrying structure 120 obtained by this process can have two conductive layers (other than the pad body) with an interlayer of the organic insulation material. However, the number of conductive layers is not limited. By repeatedly performing a series of steps of (i) depositing an organic insulation layer, (ii) exposing and developing the organic insulation layer, (iii) forming a seed layer, (iv) depositing a plating resist, (v) exposing and developing the plating resist, (vi) depositing a conductive layer, (vii) removing the plating resist and (viii) removing the seed layer, each conductive layer is stacked with an interlayer of the organic insulation material in one-by-one manner.

The aforementioned fabrication process of the interconnection layer carrying structure 120 is cost-effective, and it allows us to increase the number of interconnection layer carrying structures that are cut from a single wafer or panel.

Hereinafter, further referring to FIGS. 16A-16D, FIGS. 17A-17C, FIGS. 18A-18D, FIGS. 19A-19D and FIGS. 20A-20C together with FIGS. 10A-10F and FIGS. 11A-11D, an alternative process for fabricating an interconnection layer carrying structure according to other exemplary embodiment of the present disclosure, is described. FIGS. 10A-10F, FIGS. 11A-11D, FIGS. 16A-16D, FIG. 17A-17C, FIGS. 18A-18D, FIGS. 19A-19D and FIGS. 20A-20C illustrate cross-sectional views of structures obtained during the alternative fabrication process of the interconnection layer carrying structure 120.

Since the steps shown in a series of FIGS. 10A-10F and FIGS. 11A-11D are the same as the aforementioned exemplary embodiment, hereinafter, description will be made from the step of FIG. 16A. By performing the steps of FIGS. 10A-10F and FIGS. 11A-11D, a structure including a support substrate 200; a release layer 202 formed on the support substrate 200; a set of pads 140, 141, 142 (including a first seed metal layer 204, a barrier metal layer 210, and a first conductive layer 212) formed on release layer 202; and a first organic insulation part 214 that is formed on the release layer 202 but is not exposed and developed yet, is obtained.

Figure 16A:
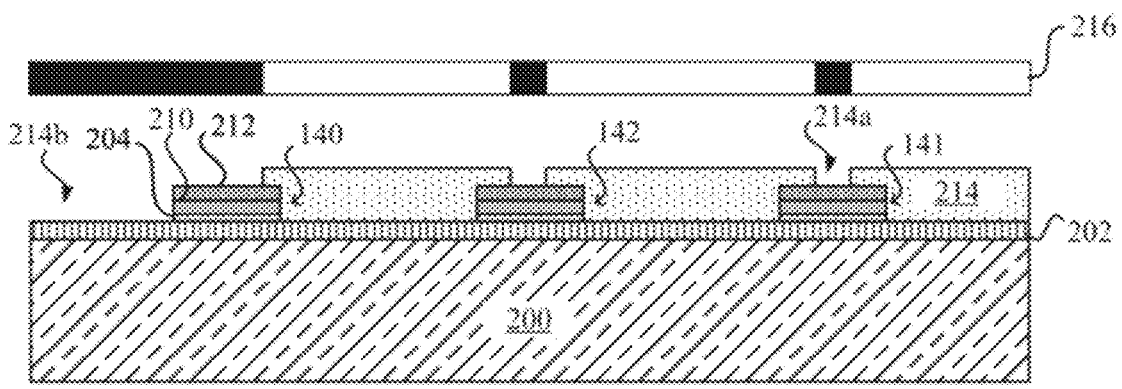
FIG. 16A illustrates a cross-sectional view of structures obtained during a fabrication process of the interconnection layer carrying structure according to other exemplary embodiment of the present disclosure.

As shown in FIG. 16A, the fabrication process can include exposing and developing the first organic insulation part 214 so as to have a plurality of a via openings 214a at the positions of the pads 140, 141, 142 and to expose one edge of the side connection pad 140 as indicated by an opening space 214b in FIG. 16A. FIG. 16A shows a scenario in which a negative type resist is used.

Figure 16B:
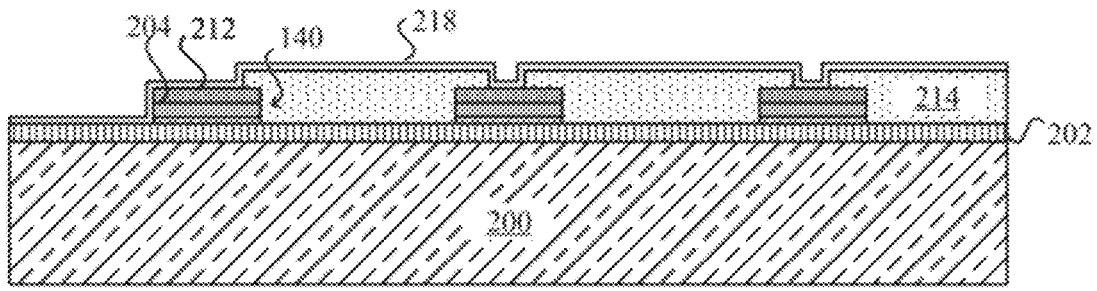
FIG. 16B illustrates a cross-sectional view of structures obtained during a fabrication process of the interconnection layer carrying structure according to other exemplary embodiment of the present disclosure.

As shown in FIG. 16B, the fabrication process can include forming a second seed metal layer 218 onto the top surface of the first organic insulation part 214, the exposed surfaces of the first conductive layer 212 in the via openings 214a and the opening space 214b and the exposed surface of the release layer 202 in the opening space 214b.

Figure 16C:
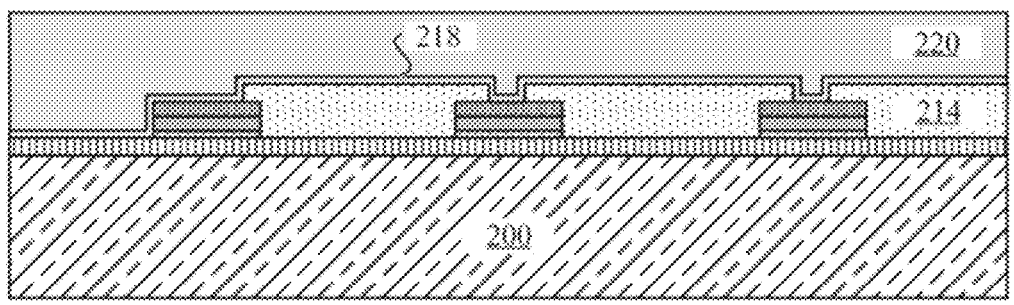
FIG. 16C illustrates a cross-sectional view of structures obtained during a fabrication process of the interconnection layer carrying structure according to other exemplary embodiment of the present disclosure.
Figure 16D:
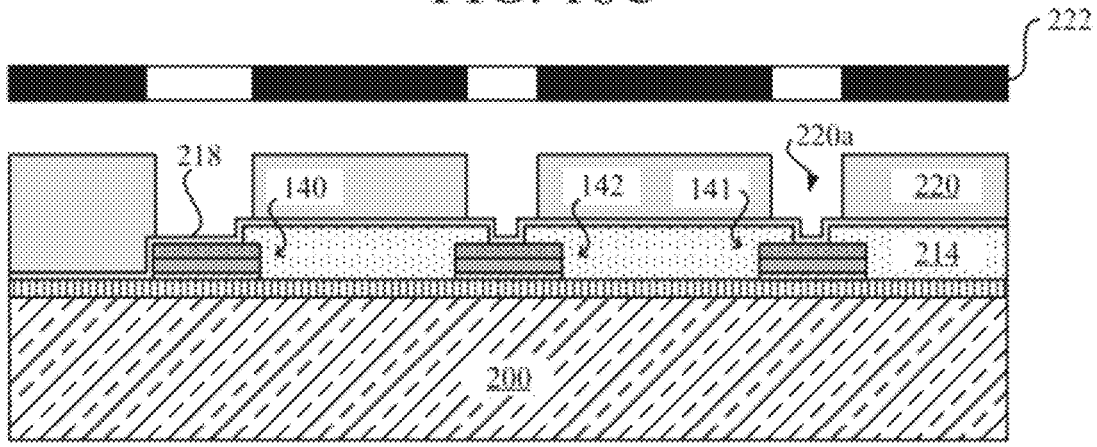
FIG. 16D illustrates a cross-sectional view of structures obtained during a fabrication process of the interconnection layer carrying structure according to other exemplary embodiment of the present disclosure.
Figure 17A:
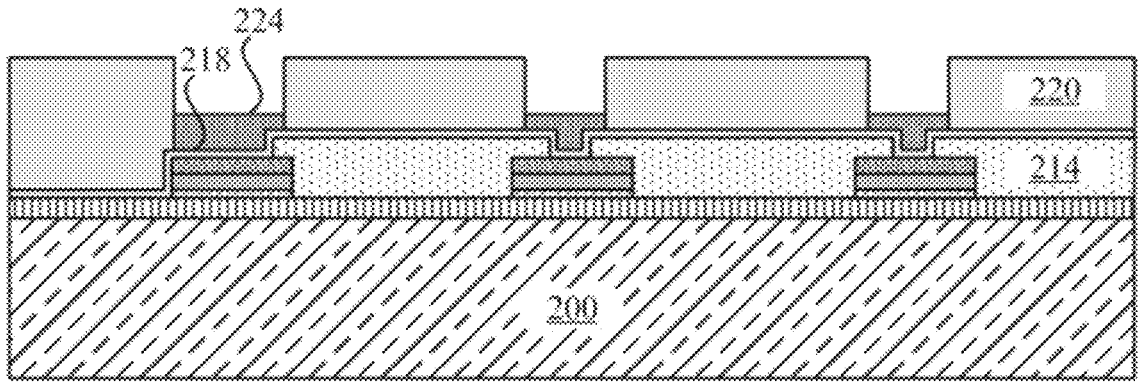
FIG. 17A illustrates a cross-sectional view of structures obtained during the fabrication process of the interconnection layer carrying structure according to the other exemplary embodiment of the present disclosure.
Figure 17B:
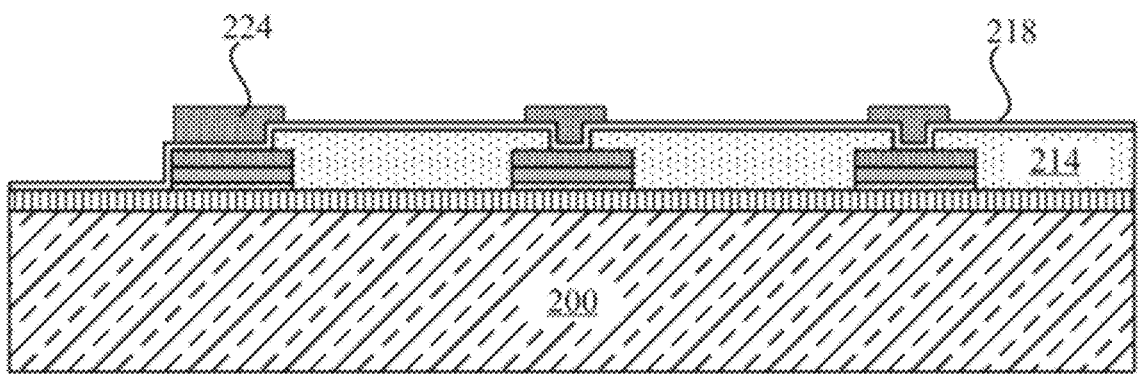
FIG. 17B illustrates a cross-sectional view of structures obtained during the fabrication process of the interconnection layer carrying structure according to the other exemplary embodiment of the present disclosure.
Figure 17C:
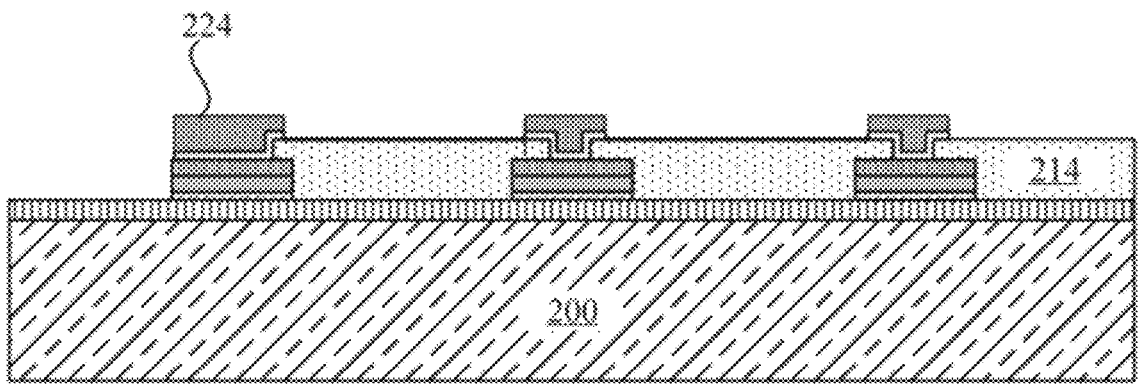
FIG. 17C illustrates a cross-sectional view of structures obtained during the fabrication process of the interconnection layer carrying structure according to the other exemplary embodiment of the present disclosure.

As shown in FIG. 16C, the fabrication process can include depositing a plating resist 220 onto the second seed metal layer 218. As shown in FIG. 16D, the fabrication process can include patterning an opening pattern 220a into the plating resist 220. As shown in FIG. 17A, the fabrication process can include depositing a second conductive layer 224 on regions of the second seed metal layer 218 where there is no plating resist. As shown in FIG. 17B, the fabrication process can include removing the plating resist 220 from the second seed metal layer 218. As shown in FIG. 17C, the fabrication process can include removing portions of the second seed metal layer 218 that are exposed from the second conductive layer 224.

Figure 18A:
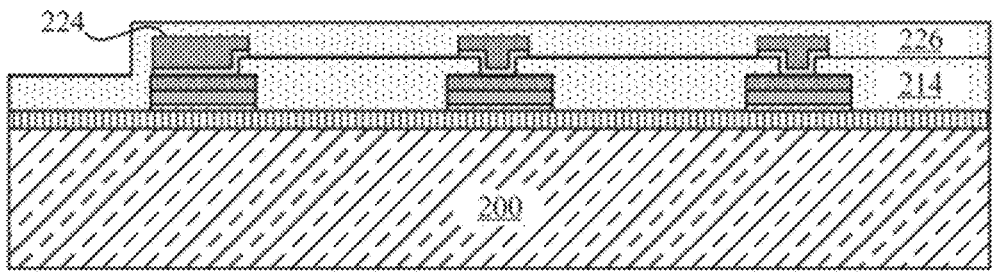
FIG. 18A illustrates a cross-sectional view of structures obtained during the fabrication process of the interconnection layer carrying structure according to the other exemplary embodiment of the present disclosure.
Figure 18B:
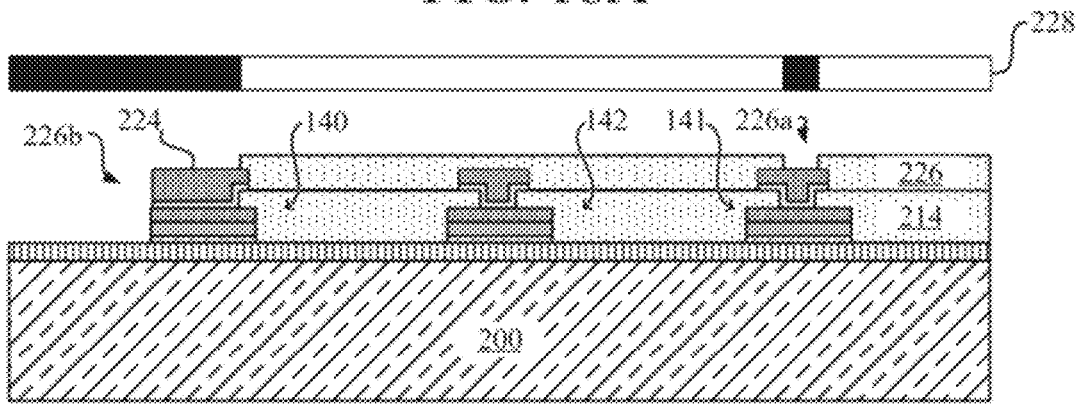
FIG. 18B illustrates a cross-sectional view of structures obtained during the fabrication process of the interconnection layer carrying structure according to the other exemplary embodiment of the present disclosure.

As shown in FIG. 18A, the fabrication process can include depositing a second organic insulation layer 226 on the first organic insulation part 214 so as to embed the second conductive layer 224. As shown in FIG. 18B, the fabrication process can include exposing and developing the second organic insulation layer 226 by using a photomask 228 so as to have a plurality of via openings 226a at the positions of the pads 140 and to expose one edge of the side connection pad 140 as indicated by an opening space 226b in FIG. 18B. FIG. 18B shows a case of using the negative type resist.

Figure 18C:
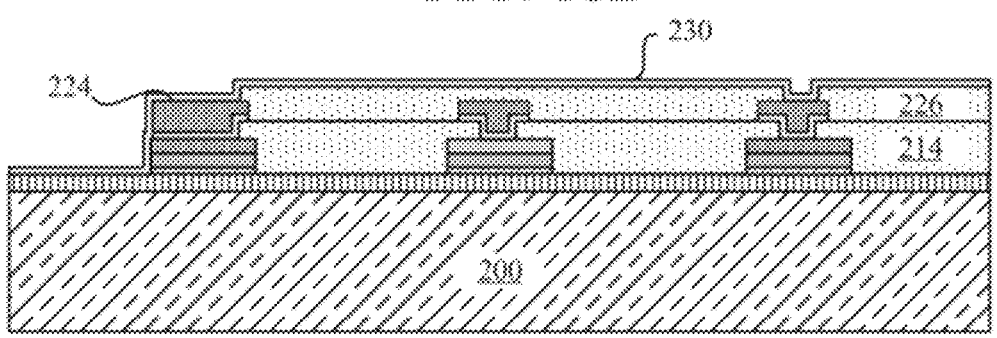
FIG. 18C illustrates a cross-sectional view of structures obtained during the fabrication process of the interconnection layer carrying structure according to the other exemplary embodiment of the present disclosure.

As shown in FIG. 18C, the fabrication process can include forming a third seed metal layer 230 onto the top surface of the second organic insulation layer 226, the exposed surfaces of the second conductive layer 224 in the via openings 226a and the opening space 226b and the exposed surface of the release layer 202 in the opening space 226b.

Figure 18D:
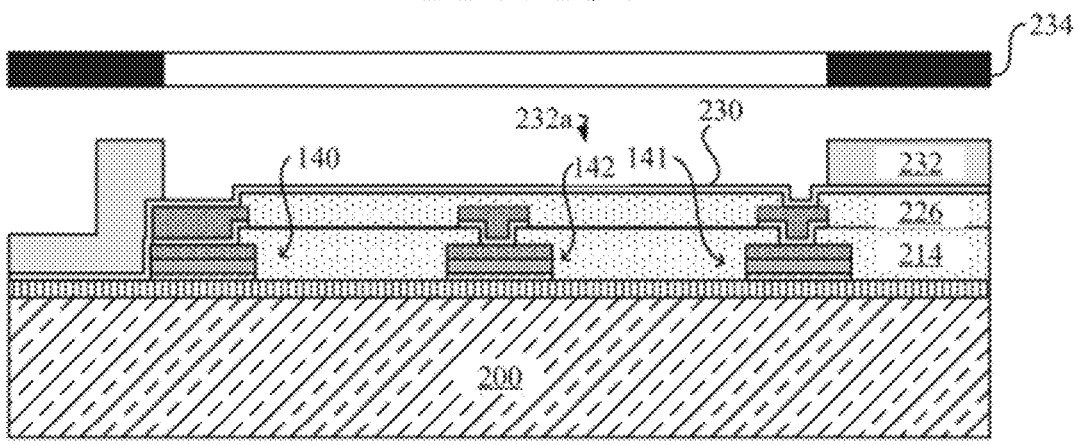
FIG. 18D illustrates a cross-sectional view of structures obtained during the fabrication process of the interconnection layer carrying structure according to the other exemplary embodiment of the present disclosure.

As shown in FIG. 18D, the fabrication process can include patterning a plating resist 232 on the third seed metal layer 230 by using a photomask 234. The plating resist 232 has an opening pattern 232a that includes a wire pattern for the pad 140, 141. FIG. 18D shows a case of using the positive type resist.

Figure 19A:
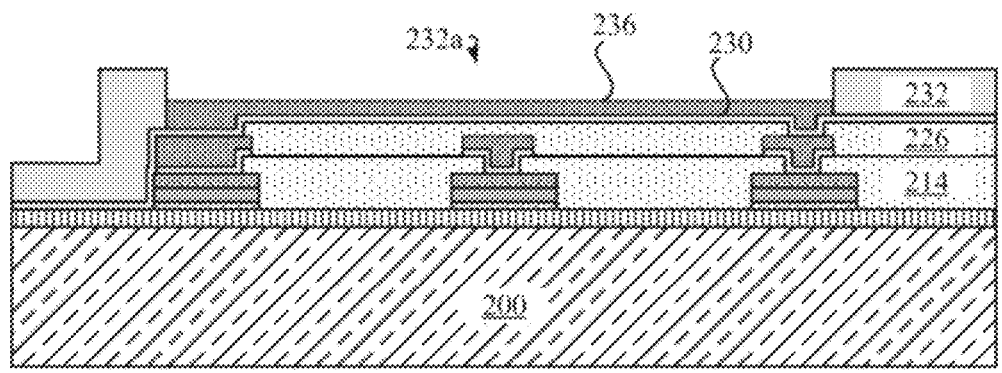
FIG. 19A illustrates a cross-sectional view of structures obtained during the fabrication process of the interconnection layer carrying structure according to the other exemplary embodiment of the present disclosure.
Figure 19B:
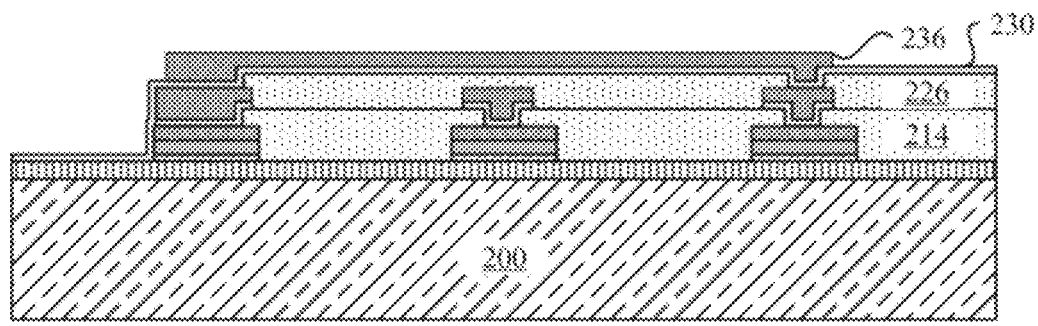
FIG. 19B illustrates a cross-sectional view of structures obtained during the fabrication process of the interconnection layer carrying structure according to the other exemplary embodiment of the present disclosure.
Figure 19C:
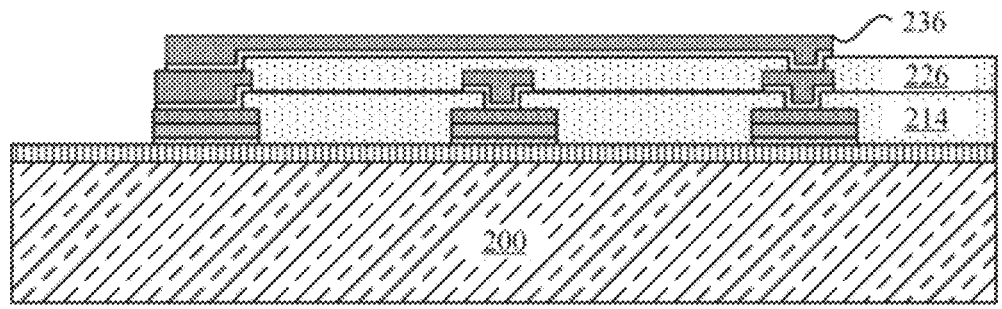
FIG. 19C illustrates a cross-sectional view of structures obtained during the fabrication process of the interconnection layer carrying structure according to the other exemplary embodiment of the present disclosure.

As shown in FIG. 19A, the fabrication process can include depositing a third conductive layer 236 on regions of the third seed metal layer 230 where there is no plating resist. As shown in FIG. 19B, the fabrication process can include removing the plating resist 232 from the third seed metal layer 230. As shown in FIG. 19C, the fabrication process can include removing portions of the third seed metal layer 230 that are exposed from the third conductive layer 236.

Figure 19D:
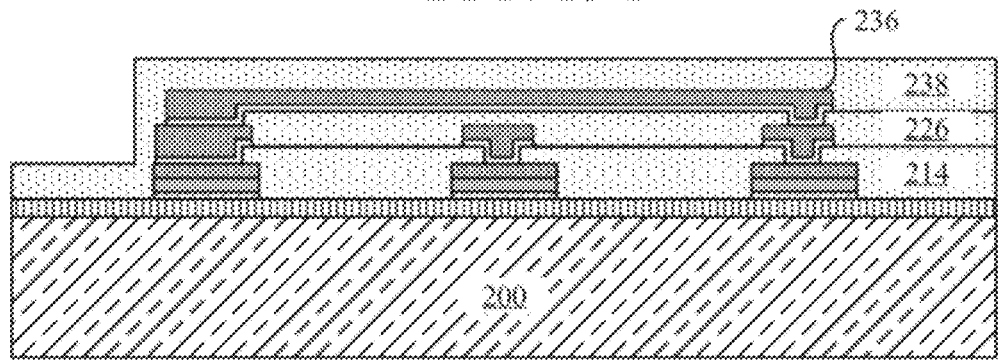
FIG. 19D illustrates a cross-sectional view of structures obtained during the fabrication process of the interconnection layer carrying structure according to the other exemplary embodiment of the present disclosure.
Figure 20A:
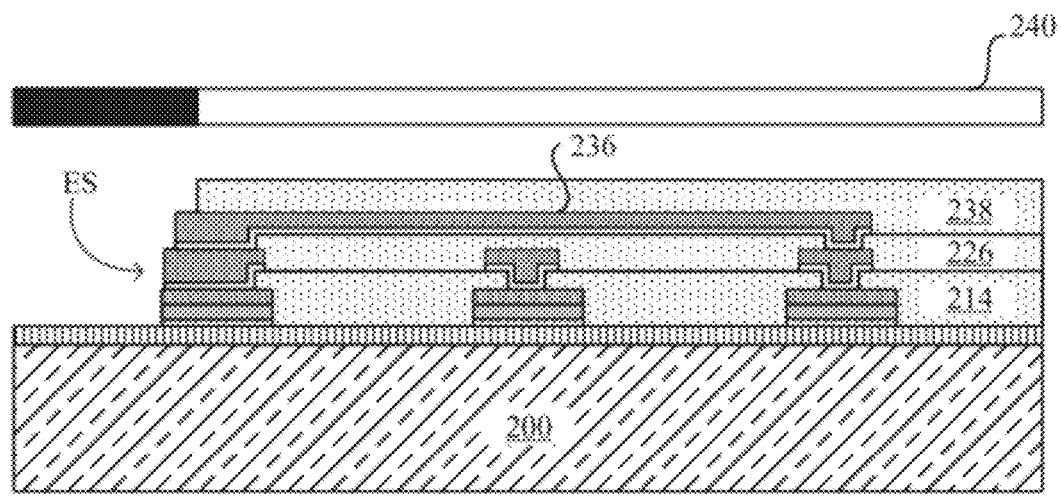
FIG. 20A illustrates a cross-sectional view of structures obtained during the fabrication process of the interconnection layer carrying structure according to the other exemplary embodiment of the present disclosure.

As shown in FIG. 19D, the fabrication process can include depositing a third organic insulation layer 238 on the second organic insulation layer 226 to embed the third conductive layer 236. As shown in FIG. 20A, the fabrication process can include exposing and developing the third organic insulation layer 238 by using a photomask 240 so as to expose the edge of the side connection pad 140.

The first organic insulation part 214, the second organic insulation layer 226 and the third organic insulation layer 238 are patterned so as to form an outline shape of the interconnection layer part 131 while exposing at least the edge surface ES of each side connection pad 140 from the organic insulation layers 214, 226, 238.

Note that the fabrication process can further include forming a barrier metal layer on the edge surface ES of the side connection pads 140 by any suitable metallization process, which can include, for example, electroless plating. The formation of the barrier metal layer on the edge surface ES can be performed at any stage where the side connection pads 140 are formed and the edge surfaces ES of the side connection pads 140 are exposed. Hence, the formation of the barrier metal layer can be completed after the following step of cutting the support substrate 200.

Figure 20B:
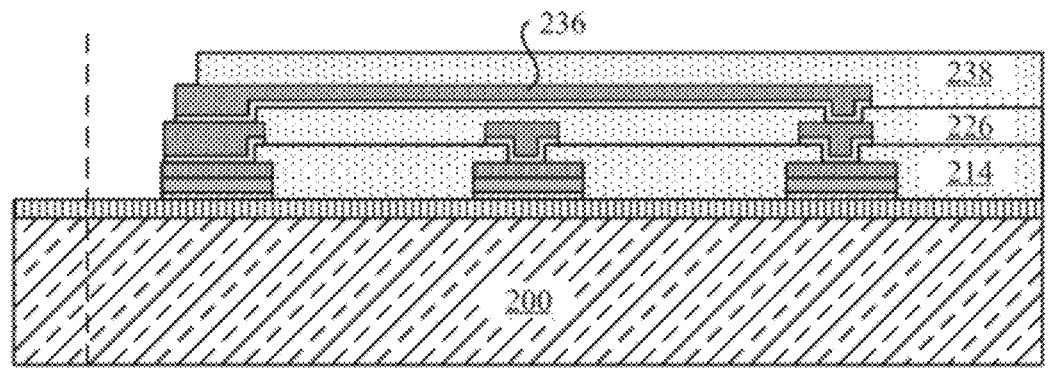
FIG. 20B illustrates a cross-sectional view of structures obtained during the fabrication process of the interconnection layer carrying structure according to the other exemplary embodiment of the present disclosure.
Figure 20C:
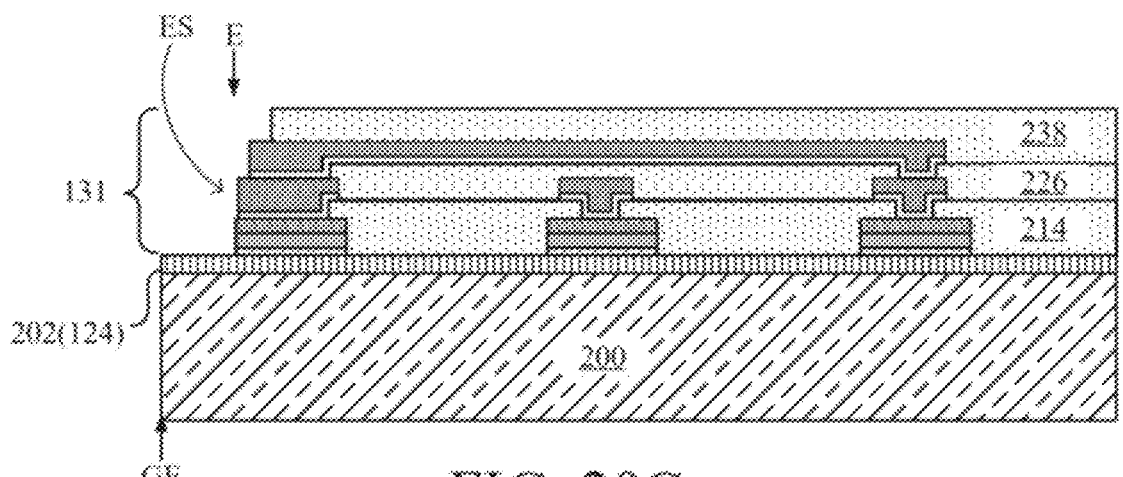
FIG. 20C illustrates a cross-sectional view of structures obtained during the fabrication process of the interconnection layer carrying structure according to the other exemplary embodiment of the present disclosure.

As shown in FIG. 20B, the fabrication process can further include cutting the support substrate 200 with the release layer 202, to obtain an individual structure shown in FIG. 20C, which is almost identical to the interconnection layer carrying structure 120 shown in FIG. 5. The cutting line is located at a position away from one edge E of the interconnection layer part 131 and the set of the side connection pads 140.

Since the outline of the interconnection layer part 131 is defined by photolithography, the edge of the interconnection layer part 131 can have any appropriate shape. Also this alternative fabrication process is advantageous for controlling the height of the top surface 130*a* of the interconnection layer 130 since extended parts (or eaves) 122*b* of both edges extending outside the base part 122*a* can be easily fabricated. It improves yield and reliability of the interconnections between the terminal bumps 151, 152, 154 and bond pads 141, 142, 112 even if the density of the interconnections becomes higher and the pitch between the pads becomes narrower.

In embodiments, the organic insulation layers 214, 226, 238 are patterned so that the edge E of the interconnection layer part 131 has a straight shape and the set of the side connection pads 140 is formed in a line, and accordingly the set of the corresponding conductive pads 114 is also formed in a line.

In embodiments, the organic insulation layers 214, 226, 238 are patterned so that the edge E of the interconnection layer part 131 has one or more curved or angular shapes to extend the length of the edge E and the set of the side connection pads 140 are formed along a contour of the one or more curved or angular shapes. Accordingly, the set of the conductive pads 114 is also formed along a contour of the one or more curved or angular shapes.

Figure 21B:
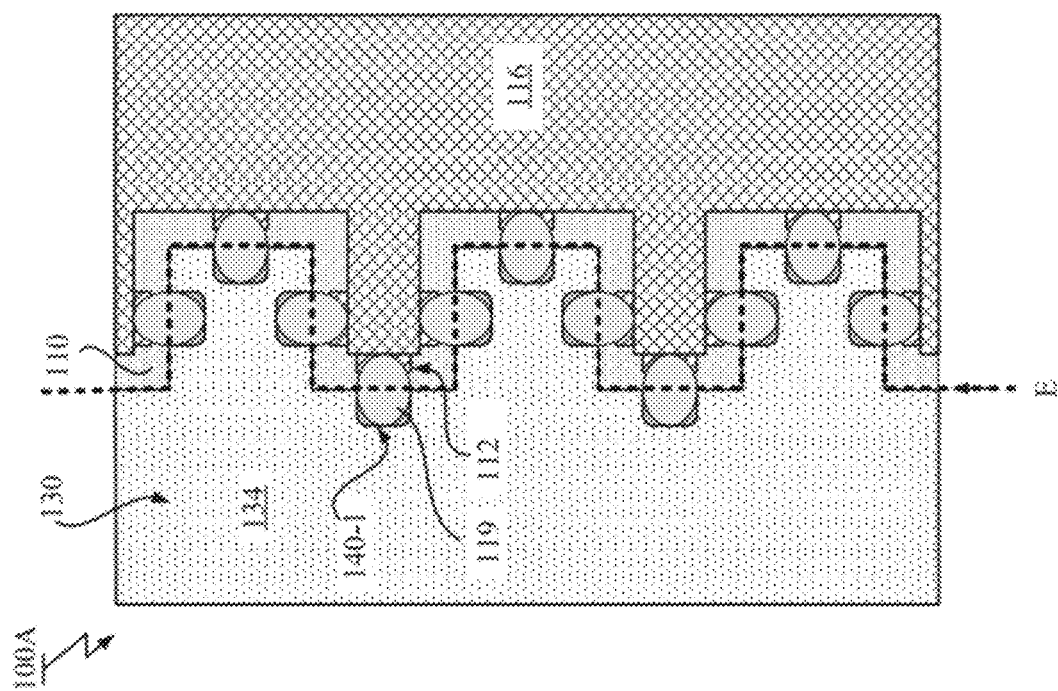
FIG. 21B illustrates a top view of an interconnection substrate without and with solder joints according to embodiments of the present disclosure, respectively.
Figure 21A:
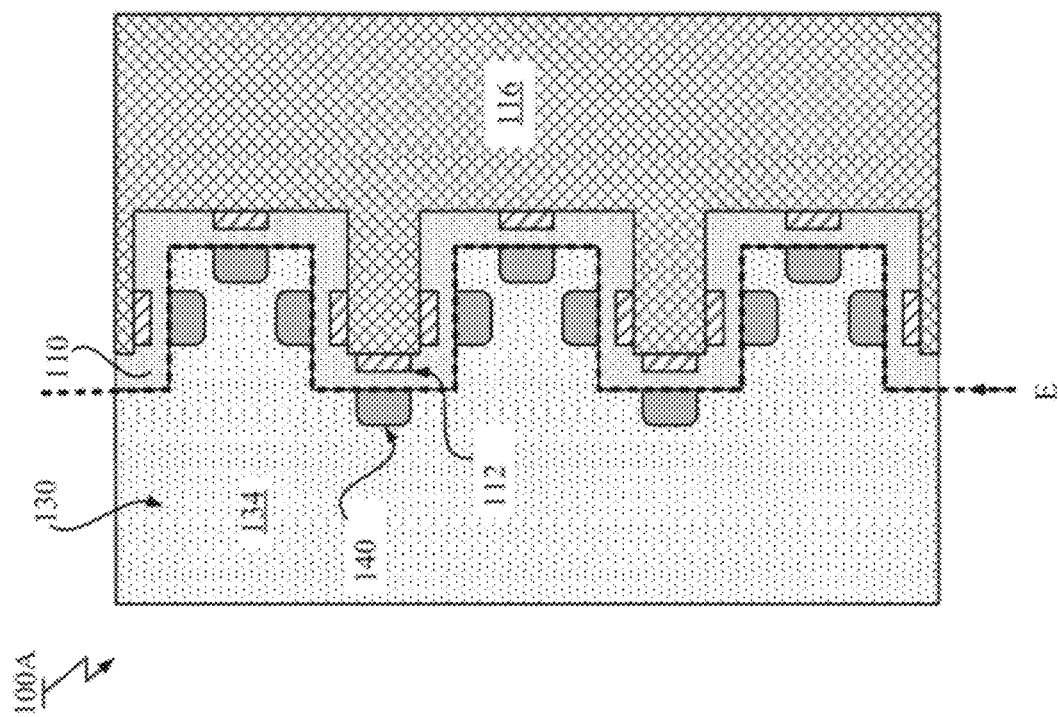
FIG. 21A illustrates a top view of an interconnection substrate without and with solder joints according to embodiments of the present disclosure, respectively.

With reference to FIGS. 21A and 21B, a schematic of an interconnection substrate 100A according to embodiments of the present disclosure is described. FIG. 21A shows a top view of the interconnection substrate 100A without solder joints. FIG. 21B shows a top view of the interconnection substrate 100A with solder joints. As shown in FIGS. 21A and 21B, the edge E of the interconnection layer 130 has one or more angular shapes like a square waveform. The set of the side connection pads 140 are arranged along a contour of this square waveform like shape. Also accordingly, the edge of the solder resist layer 116 adjacent to the interconnection layer 130 also has one or more angular shapes like a square waveform. The set of the conductive pads 112 are also arranged along a contour of this square waveform like shape. Since the length of the edge E is extended by the amount of the bending in comparison with a case where the edge E has a straight shape, it is possible to increase the density of the side connections.

Figure 22B:
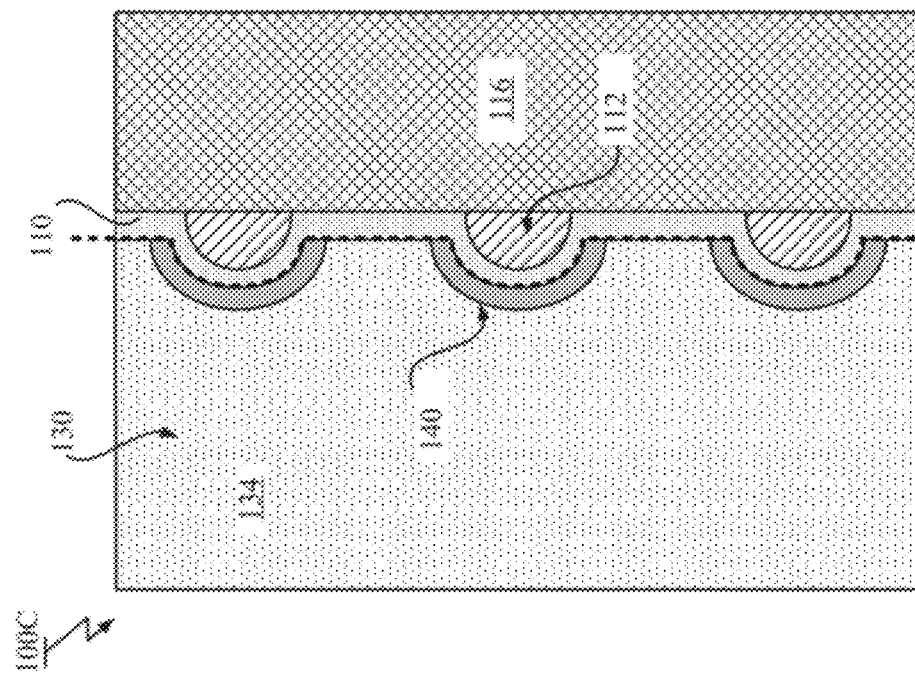
FIG. 22B illustrates a top view of interconnection substrates without solder joints according to other particular embodiments of the present disclosure.
Figure 22A:
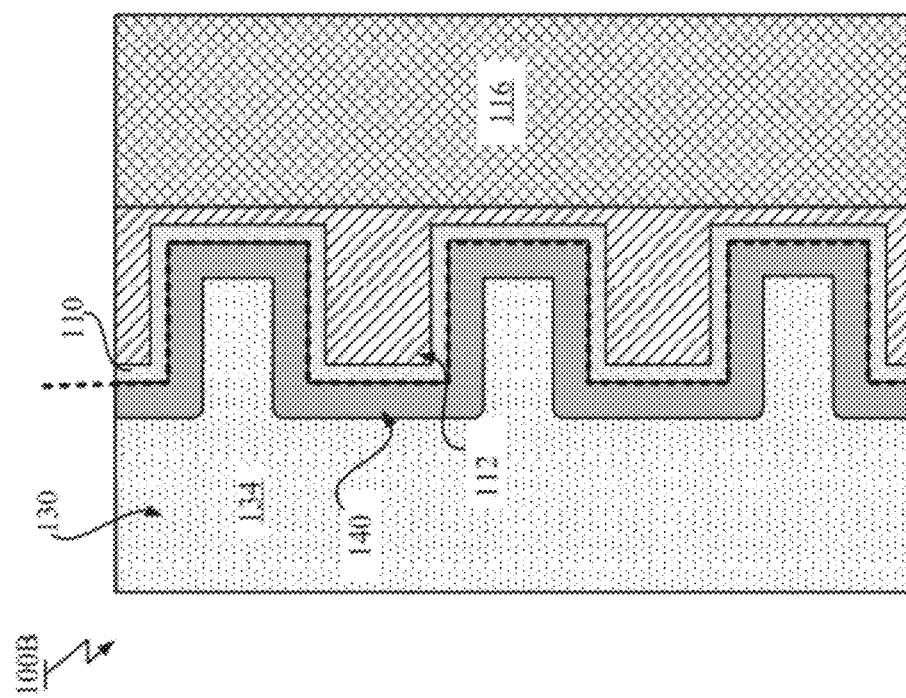
FIG. 22A illustrates a top view of interconnection substrates without solder joints according to other particular embodiments of the present disclosure.

With reference to FIG. 22A, a schematic of an interconnection substrate 100B according to other particular embodiment of the present disclosure is described. FIG. 22A illustrates a top view of interconnection substrate 100B without solder joints. As shown in FIG. 22A, the edge E of the interconnection layer 130 has one or more angular shapes like a square waveform to extend the length of the edge E as similar to the embodiment shown in FIGS. 21A, 21B. The side connection pad 140 is formed along a contour of this square waveform like shape. Also accordingly, the conductive pad 112 is also formed along the contour of this square waveform like shape.

With reference to FIG. 22B, a schematic of an interconnection substrate 100C according to another particular embodiment of the present disclosure is described. FIG. 22B illustrates a top view of interconnection substrate 100C without solder joints. As shown in FIG. 22B, the edge E of the interconnection layer 130 has one or more curved shapes. The side connection pad 140 is formed along a contour of these curved shapes. The conductive pad 112 is also formed along a contour of these curved shapes.

In the interconnection substrates 100B, 100C, since the length of the edge E is extended by the amount of the bending, it is possible to increase contact areas for each side connection instead of increasing the density of the side connection.

The interconnection structure according to one or more embodiments of the present disclosure enables the introduction of a novel side connection between the conductive pad 114 of the organic base substrate 110 and the side connection pad 140 of the interconnection layer 130. Introduction of the novel side connection improves flexibility for routing of wiring with the interconnection layer 130. Thereby, it is possible to improve performance of an electronic device using the interconnection structure since the wiring can be optimized according to the improved routing flexibility. Also, it relaxes constraints on terminal layout of a chip that uses the interconnection layer 130.

As discussed in more detail herein, it is contemplated that some or all of the operations of some of the embodiments of methods described herein can be performed in alternative orders or may not be performed at all; furthermore, multiple operations can occur at the same time or as an internal part of a larger process.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. But, the various embodiments can be practiced without these specific details. In other instances, well-known circuits, structures, and techniques have not been shown in detail in order not to obscure embodiments.

Different instances of the word "embodiment" as used within this specification do not necessarily refer to the same embodiment, but they can. Any data and data structures illustrated or described herein are examples only, and in other embodiments, different amounts of data, types of data, fields, numbers and types of fields, field names, numbers and types of rows, records, entries, or organizations of data can be used. In addition, any data can be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A method comprising:
   providing a carrier;
   depositing an organic layer on the carrier, wherein the organic layer includes a multi-layer wiring structure therein, and an uppermost surface is covered with an organic top layer;
   depositing a sacrificial layer on the organic top layer, wherein the sacrificial layer is a multi-layer structure including a Titanium layer deposited on top of the organic top layer and a Copper layer deposited on top of the Titanium layer; and
   dicing the carrier and the organic layer together with the sacrificial layer.

2. The method of claim 1, wherein the sacrificial layer is removed after the dicing.

3. The method of claim 1, wherein the sacrificial layer is comprised of a metal and is formed using a sputtering process.

4. The method of claim 1, wherein the Titanium layer is between 25-100 nm thick and the Copper layer is between 100-500 nm thick.

5. The method of claim 1, wherein the sacrificial layer is formed from a non-metal using a chemical vapor deposition (CVD) process.

6. A method for fabricating an interconnection layer carrying structure comprising:
   providing a support substrate;
   forming a release layer on the support substrate;
   forming a set of pads on the release layer;
   connecting the set of pads using a conductive material;
   depositing at least one organic layer over the set of pads;
   depositing a sacrificial layer over the at least one organic layer, wherein the sacrificial layer is a multi-layer structure including a Titanium layer deposited on top of the at least one organic layer and a Copper layer deposited on top of the Titanium layer; and
   dicing the support substrate, the release layer, and the at least one organic layer together with the sacrificial layer.

7. The method of claim 6, wherein the sacrificial layer is removed after the dicing.

8. The method of claim 6, wherein the sacrificial layer is comprised of a metal and is formed using a sputtering process.

9. The method of claim 6, wherein the Titanium layer is between 25-100 nm thick and the Copper layer is between 100-500 nm thick.

10. An interconnection layer carrying structure comprising:
    a support substrate;
    a release layer deposited on the support substrate;
    a set of pads deposited on the release layer, wherein the set of pads are connected using a conductive material;
    at least one organic layer deposited over the set of pads; and
    a sacrificial layer deposited over the at least one organic layer, wherein the sacrificial layer is a multi-layer structure including a Titanium layer deposited on top of the at least one organic layer and a Copper layer deposited on top of the Titanium layer, wherein the support substrate, the release layer, and the at least one organic layer are diced together with the sacrificial layer.

11. The interconnection layer carrying structure of claim 10, wherein the sacrificial layer is removed after the dicing.

12. The interconnection layer carrying structure of claim 10, wherein the sacrificial layer is comprised of a metal and is formed using a sputtering process.

13. The interconnection layer carrying structure of claim 10, wherein the Titanium layer is between 25-100 nm thick and the Copper layer is between 100-500 nm thick.

14. The interconnection layer carrying structure of claim 10, wherein the interconnection layer carrying structure is used to fabricate an interconnection structure.

\* \* \* \* \*